(12) United States Patent
Chung

(10) Patent No.: US 10,535,413 B2
(45) Date of Patent: Jan. 14, 2020

(54) LOW POWER READ OPERATION FOR PROGRAMMABLE RESISTIVE MEMORIES

(71) Applicant: Shine C. Chung, San Jose, CA (US)

(72) Inventor: Shine C. Chung, San Jose, CA (US)

(73) Assignee: Attopsemi Technology Co., LTD, Hsinchu (TW)

( * ) Notice: Subject to any disclaimer, the term of this patent is extended or adjusted under 35 U.S.C. 154(b) by 0 days.

(21) Appl. No.: 15/953,422

(22) Filed: Apr. 14, 2018

(65) Prior Publication Data

US 2018/0301198 A1    Oct. 18, 2018

Related U.S. Application Data

(60) Provisional application No. 62/485,895, filed on Apr. 14, 2017.

(51) Int. Cl.
| | |
|---|---|
| *G11C 11/16* | (2006.01) |
| *G11C 17/18* | (2006.01) |
| *G11C 17/16* | (2006.01) |
| *G11C 16/04* | (2006.01) |
| *G11C 16/28* | (2006.01) |
| *G11C 13/00* | (2006.01) |
| *G11C 11/22* | (2006.01) |

(52) U.S. Cl.
CPC .......... *G11C 17/18* (2013.01); *G11C 11/1673* (2013.01); *G11C 11/2273* (2013.01); *G11C 13/004* (2013.01); *G11C 16/0408* (2013.01); *G11C 16/28* (2013.01); *G11C 17/165* (2013.01); *G11C 13/0004* (2013.01)

(58) Field of Classification Search
CPC ............................ G11C 17/16; G11C 11/1675
USPC .................................................... 365/96, 158
See application file for complete search history.

(56) References Cited

U.S. PATENT DOCUMENTS

| | | | |
|---|---|---|---|
| 3,198,670 A | 8/1965 | Nissim | |
| 3,715,242 A | 2/1973 | Daniel | |
| (Continued) | | | |

FOREIGN PATENT DOCUMENTS

| | | |
|---|---|---|
| CN | 1469473 A | 1/2004 |
| CN | 1691204 A | 11/2005 |
| (Continued) | | |

OTHER PUBLICATIONS

U.S. Appl. No. 13/471,704, filed May 15, 2012.
(Continued)

*Primary Examiner* — Michael T Tran

(57) ABSTRACT

A programmable resistive memory has a plurality of programmable resistive devices (PRD) and at least one sensing circuit. The at least one of the programmable resistive device can include at least one programmable resistive element (PRE). The sensing circuit can include one PRD unit and a reference unit. Each unit has at least one capacitor to charge to a second supply voltage line and to discharge to the first supply voltage line through the PRE and the reference element, respectively. The capacitors are also coupled to comparators to monitor discharging voltages with respect to a reference voltage. By comparing the time difference when the comparators change their outputs, the magnitude of the PRE resistance with respect to the reference element resistance can be determined and converted into logic states.

19 Claims, 6 Drawing Sheets

(56) References Cited

U.S. PATENT DOCUMENTS

| | | | |
|---|---|---|---|
| 4,148,046 | A | 4/1979 | Hendrickson et al. |
| 4,192,059 | A | 3/1980 | Khan et al. |
| 4,642,674 | A | 2/1987 | Schoofs |
| 5,192,989 | A | 3/1993 | Matsushita et al. |
| 5,355,342 | A | 10/1994 | Ueoka |
| 5,389,552 | A | 2/1995 | Iranmanesh |
| 5,447,876 | A | 9/1995 | Moyer et al. |
| 5,548,225 | A | 8/1996 | Rountree |
| 5,600,588 | A | 2/1997 | Kawashima |
| 5,610,871 | A | 3/1997 | Hidaka |
| 5,635,742 | A | 6/1997 | Hoshi et al. |
| 5,637,901 | A | 6/1997 | Beigel et al. |
| 5,723,890 | A | 3/1998 | Fujihira et al. |
| 5,747,805 | A * | 5/1998 | Youngquist .............. H04N 5/33 250/338.4 |
| 5,757,046 | A | 5/1998 | Fujihira et al. |
| 5,761,148 | A | 6/1998 | Allan et al. |
| 5,962,903 | A | 10/1999 | Sung et al. |
| 6,002,156 | A | 12/1999 | Lin |
| 6,008,092 | A | 12/1999 | Gould |
| 6,034,882 | A | 3/2000 | Johnson et al. |
| 6,054,344 | A | 4/2000 | Liang et al. |
| 6,108,247 | A | 8/2000 | Suzu |
| 6,140,687 | A | 10/2000 | Shimormura et al. |
| 6,215,681 | B1 | 4/2001 | Schuurman |
| 6,222,244 | B1 | 4/2001 | Arndt et al. |
| 6,243,864 | B1 | 6/2001 | Odani et al. |
| 6,249,472 | B1 | 6/2001 | Tamura et al. |
| 6,346,727 | B1 | 2/2002 | Ohtomo |
| 6,388,292 | B1 | 5/2002 | Lin |
| 6,400,540 | B1 | 6/2002 | Chang |
| 6,405,160 | B1 | 6/2002 | Djaja et al. |
| 6,461,934 | B2 | 10/2002 | Nishida et al. |
| 6,483,734 | B1 | 11/2002 | Sharma et al. |
| 6,597,629 | B1 | 7/2003 | Raszka et al. |
| 6,611,043 | B2 | 8/2003 | Takiguchi |
| 6,731,535 | B1 | 5/2004 | Ooishi et al. |
| 6,770,953 | B2 | 8/2004 | Boeck et al. |
| 6,798,684 | B2 | 9/2004 | Low et al. |
| 6,803,804 | B2 | 10/2004 | Madurawe |
| 6,813,705 | B2 | 11/2004 | Duesterwald et al. |
| 6,897,543 | B1 | 5/2005 | Huang et al. |
| 6,934,176 | B2 | 8/2005 | Low et al. |
| 6,944,083 | B2 | 9/2005 | Pedlow |
| 6,967,879 | B2 | 11/2005 | Mizukoshi |
| 7,009,182 | B2 | 3/2006 | Kannan et al. |
| 7,102,951 | B2 | 9/2006 | Paillet et al. |
| 7,167,397 | B2 | 1/2007 | Paillet et al. |
| 7,211,843 | B2 | 5/2007 | Low et al. |
| 7,212,432 | B2 | 5/2007 | Ferrant et al. |
| 7,224,598 | B2 | 5/2007 | Perner |
| 7,263,027 | B2 | 8/2007 | Kim et al. |
| 7,294,542 | B2 | 11/2007 | Okushima |
| 7,369,452 | B2 | 5/2008 | Kenkare et al. |
| 7,391,064 | B1 | 6/2008 | Tripsas et al. |
| 7,405,590 | B1 | 7/2008 | Kaneko |
| 7,411,844 | B2 | 8/2008 | Nitzan et al. |
| 7,439,608 | B2 | 10/2008 | Arendt |
| 7,450,414 | B2 | 11/2008 | Scheuerlein |
| 7,461,371 | B2 | 12/2008 | Luo et al. |
| 7,573,762 | B2 | 8/2009 | Kenkare et al. |
| 7,579,232 | B1 | 8/2009 | Ping |
| 7,589,367 | B2 | 9/2009 | Oh et al. |
| 7,609,578 | B2 | 10/2009 | Buer et al. |
| 7,660,181 | B2 | 2/2010 | Kumar et al. |
| 7,696,017 | B1 | 4/2010 | Tripsas et al. |
| 7,701,038 | B2 | 4/2010 | Chen et al. |
| 7,715,246 | B1 * | 5/2010 | Kim .................. G11C 7/18 365/189.05 |
| 7,759,766 | B2 | 7/2010 | Booth |
| 7,764,532 | B2 | 7/2010 | Kurjanowicz et al. |
| 7,772,591 | B1 | 8/2010 | Shih et al. |
| 7,802,057 | B2 | 9/2010 | Iyer et al. |
| 7,808,815 | B2 | 10/2010 | Ro et al. |
| 7,830,697 | B2 | 11/2010 | Herner |
| 7,833,823 | B2 | 11/2010 | Klersy |
| 7,834,659 | B1 | 11/2010 | Im et al. |
| 7,852,656 | B2 | 12/2010 | Shin et al. |
| 7,859,920 | B2 | 12/2010 | Jung |
| 7,889,204 | B2 | 2/2011 | Hansen et al. |
| 7,910,999 | B2 | 3/2011 | Lee et al. |
| 8,008,723 | B2 | 8/2011 | Nagai |
| 8,050,129 | B2 | 11/2011 | Liu et al. |
| 8,089,137 | B2 | 1/2012 | Lung et al. |
| 8,115,280 | B2 | 2/2012 | Chen et al. |
| 8,119,048 | B2 | 2/2012 | Nishimura |
| 8,154,005 | B2 | 4/2012 | Hsia |
| 8,168,538 | B2 | 5/2012 | Chen et al. |
| 8,174,063 | B2 | 5/2012 | Liu et al. |
| 8,174,922 | B2 | 5/2012 | Naritake |
| 8,179,711 | B2 | 5/2012 | Kim et al. |
| 8,183,665 | B2 | 5/2012 | Bertin et al. |
| 8,203,899 | B2 * | 6/2012 | Chen .................. G11C 7/062 365/148 |
| 8,217,490 | B2 | 7/2012 | Bertin et al. |
| 8,233,316 | B2 | 7/2012 | Liu et al. |
| 8,339,079 | B2 | 12/2012 | Yamada |
| 8,369,166 | B2 | 2/2013 | Kurjanowicz et al. |
| 8,373,254 | B2 | 2/2013 | Chen et al. |
| 8,380,768 | B2 | 2/2013 | Hoefler |
| 8,415,764 | B2 | 4/2013 | Chung |
| 8,482,972 | B2 | 7/2013 | Chung |
| 8,488,359 | B2 | 7/2013 | Chung |
| 8,488,364 | B2 | 7/2013 | Chung |
| 8,503,141 | B2 | 8/2013 | Mallikarjunaswamy |
| 8,514,606 | B2 | 8/2013 | Chung |
| 8,526,254 | B2 | 9/2013 | Kurjanowicz et al. |
| 8,559,208 | B2 | 10/2013 | Chung |
| 8,570,800 | B2 | 10/2013 | Chung |
| 8,576,602 | B2 | 11/2013 | Chung |
| 8,598,639 | B2 | 12/2013 | Hsin |
| 8,643,085 | B2 | 2/2014 | Pfirsch |
| 8,644,049 | B2 | 2/2014 | Chung |
| 8,648,349 | B2 | 2/2014 | Masuda et al. |
| 8,649,203 | B2 | 2/2014 | Chung |
| 8,680,620 | B2 | 3/2014 | Salcedo |
| 8,699,259 | B2 | 4/2014 | Zhang et al. |
| 8,760,904 | B2 | 6/2014 | Chung |
| 8,804,398 | B2 | 8/2014 | Chung |
| 8,817,563 | B2 | 8/2014 | Chung |
| 8,830,720 | B2 | 9/2014 | Chung |
| 8,848,423 | B2 | 9/2014 | Chung |
| 8,854,859 | B2 | 10/2014 | Chung |
| 8,861,249 | B2 | 10/2014 | Chung |
| 8,913,415 | B2 | 12/2014 | Chung |
| 8,913,449 | B2 | 12/2014 | Chung |
| 8,923,070 | B2 | 12/2014 | Xia |
| 8,923,085 | B2 | 12/2014 | Chung |
| 8,929,122 | B2 | 1/2015 | Chung |
| 8,988,965 | B2 | 3/2015 | Chung |
| 9,019,742 | B2 | 4/2015 | Chung |
| 9,019,791 | B2 | 4/2015 | Chung |
| 9,025,357 | B2 | 5/2015 | Chung |
| 9,070,437 | B2 | 6/2015 | Chung |
| 9,178,100 | B2 | 11/2015 | Webster |
| 9,196,373 | B2 * | 11/2015 | Nigam .................... G11C 7/08 |
| 9,236,141 | B2 | 1/2016 | Chung |
| 9,281,038 | B2 | 3/2016 | Chung |
| 9,305,973 | B2 | 4/2016 | Chung |
| 9,324,447 | B2 | 4/2016 | Chung |
| 9,324,849 | B2 | 4/2016 | Chung |
| 9,343,176 | B2 | 5/2016 | Chung |
| 9,378,817 | B2 * | 6/2016 | Kawai ................ G11C 13/0069 |
| 9,449,687 | B1 * | 9/2016 | Piccardi ................ G11C 13/004 |
| 9,460,807 | B2 | 10/2016 | Chung |
| 9,478,306 | B2 | 10/2016 | Chung |
| 9,548,109 | B2 | 1/2017 | Chung |
| 9,548,131 | B1 * | 1/2017 | Bill ........................ G11C 7/062 |
| 9,767,915 | B2 | 9/2017 | Chung |
| 9,818,478 | B2 | 11/2017 | Chung |
| 9,838,025 | B1 * | 12/2017 | Deng .................... H03L 7/0891 |
| 9,852,783 | B1 * | 12/2017 | Na ...................... G11C 11/1673 |
| 9,981,970 | B2 | 1/2018 | Chung |
| 9,941,001 | B2 * | 4/2018 | Harvard ................ G11C 13/004 |

(56) References Cited

U.S. PATENT DOCUMENTS

| | | | |
|---|---|---|---|
| 9,952,944 B1* | 4/2018 | Alrod | G11C 16/08 |
| 10,049,713 B2* | 8/2018 | Di Vincenzo | G11C 11/221 |
| 10,068,652 B2* | 9/2018 | Finkbeiner | G11C 16/26 |
| 10,074,407 B2* | 9/2018 | Manning | G11C 7/08 |
| 10,192,615 B2 | 1/2019 | Chung | |
| 10,218,166 B2* | 2/2019 | Bass | H02H 3/08 |
| 2002/0018355 A1 | 2/2002 | Johnson et al. | |
| 2002/0075744 A1 | 6/2002 | McCollum | |
| 2002/0168821 A1 | 11/2002 | Williams et al. | |
| 2002/0196659 A1 | 12/2002 | Hurst et al. | |
| 2003/0104860 A1 | 6/2003 | Cannon et al. | |
| 2003/0135709 A1 | 7/2003 | Niles et al. | |
| 2003/0169625 A1 | 9/2003 | Hush et al. | |
| 2004/0057271 A1 | 3/2004 | Parkinson | |
| 2004/0113183 A1 | 6/2004 | Karpov et al. | |
| 2004/0130924 A1 | 7/2004 | Ma et al. | |
| 2005/0052915 A1 | 3/2005 | Herner | |
| 2005/0060500 A1 | 3/2005 | Luo et al. | |
| 2005/0062110 A1 | 3/2005 | Dietz et al. | |
| 2005/0110081 A1 | 5/2005 | Pendharkar | |
| 2005/0124116 A1 | 6/2005 | Hsu et al. | |
| 2005/0146962 A1 | 7/2005 | Schreck | |
| 2005/0242386 A1 | 11/2005 | Ang | |
| 2006/0072357 A1 | 4/2006 | Wicker | |
| 2006/0092689 A1 | 5/2006 | Braun et al. | |
| 2006/0104111 A1 | 5/2006 | Tripsas et al. | |
| 2006/0120148 A1 | 6/2006 | Kim et al. | |
| 2006/0129782 A1 | 6/2006 | Bansal et al. | |
| 2006/0215440 A1 | 9/2006 | Cho et al. | |
| 2006/0244099 A1 | 11/2006 | Kurjanowicz | |
| 2007/0004160 A1 | 1/2007 | Voldman | |
| 2007/0008776 A1 | 1/2007 | Scheuerlein et al. | |
| 2007/0030026 A1 | 2/2007 | Hsu et al. | |
| 2007/0057323 A1 | 3/2007 | Furukawa et al. | |
| 2007/0058422 A1 | 3/2007 | Phillips | |
| 2007/0081377 A1 | 4/2007 | Zheng et al. | |
| 2007/0133341 A1 | 6/2007 | Lee et al. | |
| 2007/0138549 A1 | 6/2007 | Wu et al. | |
| 2007/0183213 A1 | 8/2007 | Kusakabe | |
| 2007/0218665 A1 | 9/2007 | Sutardja | |
| 2007/0223266 A1 | 9/2007 | Chen | |
| 2007/0279978 A1 | 12/2007 | Ho et al. | |
| 2007/0284656 A1 | 12/2007 | Radigan | |
| 2008/0025067 A1 | 1/2008 | Scheuerlein et al. | |
| 2008/0025068 A1 | 1/2008 | Scheuerlein et al. | |
| 2008/0028134 A1 | 1/2008 | Matsubara et al. | |
| 2008/0044959 A1 | 2/2008 | Cheng et al. | |
| 2008/0067601 A1 | 3/2008 | Chen | |
| 2008/0105878 A1 | 5/2008 | Ohara | |
| 2008/0137401 A1* | 6/2008 | Philipp | G11C 5/14 365/163 |
| 2008/0144354 A1 | 6/2008 | Choi | |
| 2008/0151612 A1 | 6/2008 | Pellizzer et al. | |
| 2008/0170429 A1 | 7/2008 | Bertin et al. | |
| 2008/0175060 A1 | 7/2008 | Liu et al. | |
| 2008/0185568 A1 | 8/2008 | Kwon | |
| 2008/0220560 A1 | 9/2008 | Klersy | |
| 2008/0225567 A1 | 9/2008 | Burr et al. | |
| 2008/0280401 A1 | 11/2008 | Burr et al. | |
| 2008/0316852 A1 | 12/2008 | Matsufuji et al. | |
| 2009/0039420 A1 | 2/2009 | Trivedi | |
| 2009/0055617 A1 | 2/2009 | Bansal et al. | |
| 2009/0115021 A1 | 5/2009 | Moriwaki | |
| 2009/0168493 A1 | 7/2009 | Kim et al. | |
| 2009/0172315 A1 | 7/2009 | Iyer et al. | |
| 2009/0180310 A1 | 7/2009 | Shimomura et al. | |
| 2009/0194839 A1 | 8/2009 | Bertin et al. | |
| 2009/0213660 A1 | 8/2009 | Pikhay et al. | |
| 2009/0219756 A1 | 9/2009 | Schroegmeier et al. | |
| 2009/0269932 A1 | 10/2009 | Chen | |
| 2009/0309089 A1 | 12/2009 | Hsia et al. | |
| 2010/0002501 A1 | 1/2010 | Leuschner | |
| 2010/0027326 A1 | 2/2010 | Kim et al. | |
| 2010/0034016 A1 | 2/2010 | Liu et al. | |
| 2010/0061136 A1 | 3/2010 | Koyama et al. | |
| 2010/0085798 A1 | 4/2010 | Lu et al. | |
| 2010/0091546 A1 | 4/2010 | Liu et al. | |
| 2010/0103721 A1 | 4/2010 | Guha | |
| 2010/0142254 A1 | 6/2010 | Choi et al. | |
| 2010/0157651 A1 | 6/2010 | Kumar et al. | |
| 2010/0171086 A1 | 7/2010 | Lung et al. | |
| 2010/0177547 A1 | 7/2010 | Shen | |
| 2010/0201410 A1 | 8/2010 | Illegems | |
| 2010/0219392 A1 | 9/2010 | Awaya et al. | |
| 2010/0232203 A1 | 9/2010 | Chung et al. | |
| 2010/0238701 A1 | 9/2010 | Tsukamoto et al. | |
| 2010/0246237 A1 | 9/2010 | Borot et al. | |
| 2010/0250974 A1 | 9/2010 | Ristic | |
| 2010/0277967 A1 | 11/2010 | Lee et al. | |
| 2010/0301304 A1 | 12/2010 | Chen et al. | |
| 2010/0321976 A1* | 12/2010 | Jung | G11C 11/1673 365/148 |
| 2011/0022648 A1 | 1/2011 | Harris et al. | |
| 2011/0051491 A1 | 3/2011 | Takizawa | |
| 2011/0062557 A1 | 3/2011 | Bandyopadhyay et al. | |
| 2011/0108926 A1 | 5/2011 | Bahl | |
| 2011/0127627 A1 | 6/2011 | Hoofman | |
| 2011/0128772 A1 | 6/2011 | Kim et al. | |
| 2011/0145777 A1 | 6/2011 | Iyer et al. | |
| 2011/0175199 A1 | 7/2011 | Lin et al. | |
| 2011/0186990 A1 | 8/2011 | Mawatari | |
| 2011/0222330 A1 | 9/2011 | Lee et al. | |
| 2011/0260289 A1 | 10/2011 | Oyamada | |
| 2011/0267869 A1 | 11/2011 | Hoefler | |
| 2011/0286261 A1 | 11/2011 | Sakuguchi | |
| 2011/0297912 A1 | 12/2011 | Samachisa et al. | |
| 2011/0310655 A1 | 12/2011 | Kreupl et al. | |
| 2011/0312166 A1 | 12/2011 | Yedinak et al. | |
| 2012/0032303 A1 | 2/2012 | Elkareh et al. | |
| 2012/0039107 A1 | 2/2012 | Chung | |
| 2012/0044736 A1 | 2/2012 | Chung | |
| 2012/0044737 A1 | 2/2012 | Chung | |
| 2012/0044738 A1 | 2/2012 | Chung | |
| 2012/0044739 A1 | 2/2012 | Chung | |
| 2012/0044740 A1 | 2/2012 | Chung | |
| 2012/0044743 A1 | 2/2012 | Chung | |
| 2012/0044744 A1 | 2/2012 | Chung | |
| 2012/0044745 A1 | 2/2012 | Chung | |
| 2012/0044746 A1 | 2/2012 | Chung | |
| 2012/0044747 A1 | 2/2012 | Chung | |
| 2012/0044748 A1 | 2/2012 | Chung | |
| 2012/0044753 A1 | 2/2012 | Chung | |
| 2012/0044756 A1 | 2/2012 | Chung | |
| 2012/0044757 A1 | 2/2012 | Chung | |
| 2012/0044758 A1 | 2/2012 | Chung | |
| 2012/0047322 A1 | 2/2012 | Chung | |
| 2012/0074460 A1 | 3/2012 | Kitagawa | |
| 2012/0106231 A1 | 5/2012 | Chung | |
| 2012/0120707 A1 | 5/2012 | Kim | |
| 2012/0147653 A1 | 6/2012 | Chung | |
| 2012/0147657 A1 | 6/2012 | Sekar et al. | |
| 2012/0182783 A1* | 7/2012 | Bedeschi | G11C 13/0002 365/148 |
| 2012/0209888 A1 | 8/2012 | Chung | |
| 2012/0224406 A1 | 9/2012 | Chung | |
| 2012/0224413 A1 | 9/2012 | Zhang et al. | |
| 2012/0256292 A1 | 10/2012 | Yu et al. | |
| 2012/0257435 A1 | 10/2012 | Lin | |
| 2012/0287730 A1 | 11/2012 | Kim | |
| 2012/0314472 A1 | 12/2012 | Chung | |
| 2012/0314473 A1 | 12/2012 | Chung | |
| 2012/0320656 A1 | 12/2012 | Chung | |
| 2012/0320657 A1 | 12/2012 | Chung | |
| 2013/0006559 A1* | 1/2013 | Grosjean | G01D 3/032 702/65 |
| 2013/0135503 A1* | 5/2013 | Park | H03F 1/34 348/308 |
| 2013/0148409 A1 | 6/2013 | Chung | |
| 2013/0161780 A1 | 6/2013 | Kizilyalli et al. | |
| 2013/0189829 A1 | 7/2013 | Mieczkowski et al. | |
| 2013/0200488 A1 | 8/2013 | Chung | |
| 2013/0201745 A1 | 8/2013 | Chung | |
| 2013/0201746 A1 | 8/2013 | Chung | |
| 2013/0201748 A1 | 8/2013 | Chung | |

(56) References Cited

U.S. PATENT DOCUMENTS

| | | | |
|---|---|---|---|
| 2013/0201749 A1 | 8/2013 | Chung | |
| 2013/0208526 A1 | 8/2013 | Chung | |
| 2013/0215663 A1 | 8/2013 | Chung | |
| 2013/0235644 A1 | 9/2013 | Chung | |
| 2013/0268526 A1 | 10/2013 | John et al. | |
| 2013/0268727 A1* | 10/2013 | Sohn | G11C 8/00 711/105 |
| 2013/0286710 A1 | 10/2013 | Hall | |
| 2013/0294136 A1* | 11/2013 | Siau | G11C 7/04 365/66 |
| 2013/0307821 A1* | 11/2013 | Kogo | G06F 3/044 345/174 |
| 2013/0308366 A1 | 11/2013 | Chung | |
| 2014/0010032 A1 | 1/2014 | Seshadri et al. | |
| 2014/0016394 A1 | 1/2014 | Chung et al. | |
| 2014/0071726 A1 | 3/2014 | Chung | |
| 2014/0071751 A1* | 3/2014 | Kim | G11C 16/14 365/185.03 |
| 2014/0092674 A1 | 4/2014 | Chung | |
| 2014/0124871 A1 | 5/2014 | Ko et al. | |
| 2014/0124895 A1 | 5/2014 | Salzman et al. | |
| 2014/0126266 A1 | 5/2014 | Chung | |
| 2014/0131710 A1 | 5/2014 | Chung | |
| 2014/0131711 A1 | 5/2014 | Chung | |
| 2014/0131764 A1 | 5/2014 | Chung | |
| 2014/0133056 A1 | 5/2014 | Chung | |
| 2014/0160830 A1 | 6/2014 | Chung | |
| 2014/0211567 A1 | 7/2014 | Chung | |
| 2014/0211577 A1* | 7/2014 | Ryu | G11C 11/40626 365/189.16 |
| 2014/0269135 A1 | 9/2014 | Chung | |
| 2014/0340954 A1 | 11/2014 | Chung | |
| 2014/0369133 A1* | 12/2014 | Lee | G11C 16/26 365/185.21 |
| 2015/0003142 A1 | 1/2015 | Chung | |
| 2015/0003143 A1 | 1/2015 | Chung | |
| 2015/0009743 A1 | 1/2015 | Chung | |
| 2015/0014785 A1 | 1/2015 | Chung | |
| 2015/0021543 A1 | 1/2015 | Chung | |
| 2015/0029777 A1 | 1/2015 | Chung | |
| 2015/0078060 A1 | 3/2015 | Chung | |
| 2015/0124546 A1* | 5/2015 | Son | G11C 5/147 365/226 |
| 2015/0130509 A1 | 5/2015 | Herner | |
| 2015/0137258 A1 | 5/2015 | Mittal | |
| 2015/0187414 A1* | 7/2015 | Perner | G11C 13/004 365/148 |
| 2015/0194433 A1 | 7/2015 | Ponoth | |
| 2015/0206586 A1* | 7/2015 | Chang | G11C 15/046 365/49.17 |
| 2015/0249428 A1* | 9/2015 | Huynh | H03B 5/04 365/185.18 |
| 2015/0276500 A1* | 10/2015 | Walker | G01K 7/16 365/189.011 |
| 2015/0380103 A1 | 12/2015 | Braun et al. | |
| 2016/0003880 A1* | 1/2016 | Deschildre | G01C 19/5776 324/705 |
| 2016/0034351 A1 | 2/2016 | Michael | |
| 2016/0035423 A1* | 2/2016 | Nam | G11C 16/08 365/185.11 |
| 2016/0071582 A1 | 3/2016 | Chung | |
| 2016/0078919 A1* | 3/2016 | Han | G11C 11/4091 365/207 |
| 2016/0149586 A1* | 5/2016 | Roh | H03M 3/39 341/143 |
| 2016/0268002 A1 | 9/2016 | Chen | |
| 2016/0276043 A1 | 9/2016 | Chung | |
| 2016/0329810 A1* | 11/2016 | Lee | H02M 3/07 |
| 2016/0336062 A1* | 11/2016 | Buchanan | G11C 11/1673 |
| 2016/0358648 A1* | 12/2016 | Park | G11C 13/004 |
| 2017/0053708 A1 | 2/2017 | Wong | |
| 2017/0076733 A1 | 3/2017 | Noguchi | |
| 2017/0076773 A1* | 3/2017 | Noguchi | G11C 11/1673 |
| 2017/0103699 A1* | 4/2017 | Lin | G09G 3/2092 |
| 2017/0110170 A1* | 4/2017 | Kong | G11C 7/24 |
| 2017/0110512 A1 | 4/2017 | Chung | |
| 2017/0149395 A1* | 5/2017 | Patel | H03F 3/45273 |
| 2017/0199537 A1* | 7/2017 | Duong | G05F 1/575 |
| 2017/0271005 A1* | 9/2017 | Renane | G11C 7/06 |
| 2017/0316834 A1* | 11/2017 | Huynh | G11C 29/025 |
| 2017/0364276 A1* | 12/2017 | Bhuiyan | G06F 3/0605 |
| 2017/0365360 A1* | 12/2017 | Fackenthal | G11C 29/50 |
| 2018/0005703 A1 | 1/2018 | Nguyen | |
| 2018/0059958 A1* | 3/2018 | Ryan | G11C 11/404 |
| 2018/0075906 A1 | 3/2018 | Chung | |
| 2018/0095489 A1* | 4/2018 | Fang | G05F 1/575 |
| 2018/0097447 A1* | 4/2018 | Iorio | H03K 17/163 |
| 2018/0122817 A1* | 5/2018 | Ramaswamy | H01L 28/90 |

FOREIGN PATENT DOCUMENTS

| | | |
|---|---|---|
| CN | 101057330 A | 10/2007 |
| CN | 101083227 A | 12/2007 |
| CN | 101188140 A | 5/2008 |
| CN | 101271881 A | 9/2008 |
| CN | 101483062 A | 7/2009 |
| CN | 101728412 A | 6/2010 |
| CN | 10238593 A | 3/2012 |
| CN | 102385932 A | 3/2012 |
| CN | 10261027 A | 7/2012 |
| CN | 102610272 A | 7/2012 |
| EP | 1367596 A1 | 12/2003 |
| JP | 03-264814 | 11/1991 |
| TW | I309081 | 10/2007 |

OTHER PUBLICATIONS

U.S. Appl. No. 13/026,650, filed Feb. 14, 2011.
U.S. Appl. No. 13/026,656, filed Feb. 14, 2011.
U.S. Appl. No. 13/026,664, filed Feb. 14, 2011.
U.S. Appl. No. 13/026,678, filed Feb. 14, 2011.
U.S. Appl. No. 13/026,692, filed Feb. 14, 2011.
U.S. Appl. No. 13/026,704, filed Feb. 14, 2011.
U.S. Appl. No. 13/026,717, filed Feb. 14, 2011.
U.S. Appl. No. 13/026,725, filed Feb. 14, 2011.
U.S. Appl. No. 13/026,752, filed Feb. 14, 2011.
U.S. Appl. No. 13/026,771, filed Feb. 14, 2011.
U.S. Appl. No. 13/026,783, filed Feb. 14, 2011.
U.S. Appl. No. 13/026,835, filed Feb. 14, 2011.
U.S. Appl. No. 13/026,840, filed Feb. 14, 2011.
U.S. Appl. No. 13/026,852, filed Feb. 14, 2011.
U.S. Appl. No. 13/214,198, filed Aug. 21, 2011.
U.S. Appl. No. 13/590,044, filed Aug. 20, 2012.
U.S. Appl. No. 13/590,047, filed Aug. 20, 2012.
U.S. Appl. No. 13/590,049, filed Aug. 20, 2012.
U.S. Appl. No. 13/590,050, filed Aug. 20, 2012.
U.S. Appl. No. 13/214,183, filed Aug. 20, 2011.
U.S. Appl. No. 13/288,843, filed Nov. 3, 2011.
U.S. Appl. No. 13/314,444, filed Dec. 8, 2011.
U.S. Appl. No. 13/397,673, filed Feb. 15, 2012.
U.S. Appl. No. 13/571,797, filed Aug. 10, 2012.
U.S. Appl. No. 13/678,539, filed Nov. 15, 2012.
U.S. Appl. No. 13/678,544, filed Nov. 15, 2012.
U.S. Appl. No. 13/678,541, filed Nov. 15, 2012.
U.S. Appl. No. 13/678,543, filed Nov. 15, 2012.
Ahn, S.J. et al., "Highly Reliable 50nm Contact Cell Technology for 256Mb PRAM," IEEE VLSI Tech Symp., Jun. 2005, pp. 98-99.
Alavi, Mohsen, et al., "A PROM Element Based on Salicide Allgomeration of Poly Fuses in a CMOS Logic Process," IEEE IEDM, 97, pp. 855-858.
Andre, T. W. et al., "A 4-Mb 0.18um 1T1MTJ Toggle MRAM With Balanced Three Input Sensing Scheme and Locally Mirrored Unidirectional Write Drivers," IEEE J. of Solid-State Circuits, vol. 40, No. 1, Jan. 2005, pp. 301-309.
Ang, Boon et al., "NiSi Polysilicon Fuse Reliability in 65nm Logic CMOS Technology," IEEE Trans. on Dev. Mat. Rel. vol. 7, No. 2, Jun. 2007, pp. 298-303.

(56) References Cited

OTHER PUBLICATIONS

Aziz, A. et al., "Lateral Polysilicon n+p Diodes: Effect of the Grain boundaries and of the p-Implemented Doping Level on the I-V and C-V Characteristics," Springer Proceedings in Physics, vol. 54, 1991, pp. 318-322.

Aziz, A. et al., "Lateral Polysilicon PN Diodes: Current-Voltage Characteristics Simulation Between 200K and 400K a Numerical Approach," IEEE Trans. On Elec. Dev., vol. 41, No. 2, Feb. 1994, pp. 204-211.

Banerjee, Kaustav et al., "High Current Effects in Silicide Films for Sub-0.25um VLSI Technologies," IEEE 36th IRPS, 1998, pp. 284-292.

Bedeschi, F. et al., "4-Mb MOSFET-Selected uTrench Phase-Change Memory Experimental Chip," IEEE J. of Solid-State Circuits, vol. 40, No. 7, Jul. 2005, pp. 1557-1565.

Bedeschi, F. et al., "A Bipolar-Selected Phase Change Memory Featuring Multi-Level Cell Storage," IEEE J. Sol. Stat. Cir., vol. 44, No. 1, Jan. 2009, pp. 217-227.

Bedeschi, F. et al., "A Fully Symmetrical Sense Amplifier for Non-volatile Memories," IEEE. Int. Symp. On Circuits and Systems, (ISCAS), vol. 2, 2004, pp. 625-628.

Bedeschi, F. et al., "An 8Mb Demonstrator for High-Density 1.8V Phase-Change Memories," VLIS Cir. Symp, Jun. 2004, pp. 442-445.

Bedeschi, F. et al., "Set and Reset Pulse Characterization in BJT-Selected Phase-Change Memory," IEEE Int. Symp. On Circuits and Systems (ISCAS), 2005, pp. 1270-1273.

Braganca, P. M. et al., "A Three-Terminal Approach to Developing Spin-Torque Written Magnetic Random Access Memory Cells," IEEE Trans. on Nano. vol. 8, No. 2, Mar. 2009, pp. 190-195.

Cagli, C. et al., "Evidence for threshold switching in the set process of NiO-based RRAM and physical modeling for set, reset, retention and disturb prediction," IEEE IEDM, 2008, pp. 1-4.

Chan, W. T. et al., "CMOS Compatible Zero-Mask One-Time Programmable (OTP) Memory Design," Proc. Int. Conf. Solid State Integr. Cir. Tech., Beijing, China, Oct. 20-23, 2008. pp. 861-864.

Chan, Wan Tim, et al., "CMOS Compatible Zero-Mask One Time Programmable Memory Design", Master Thesis, Hong-Kong University of Science and Technologies, 2008.

Chang, Meng-Fan et al., "Circuit Design Challenges in Embedded Memory and Resistive RAM (RRAM) for Mobile SoC and 3D-IC", Design Automation Conference (ASP-DAC), 16th Asia and South Pacific, 2011, pp. 197-203.

Cheng, Yu-Hsing et al., "Failure Analysis and Optimization of Metal Fuses for Post Package Trimming," IEEE 45th IRPS, 2007, pp. 616-617.

Chiu, Pi-Feng et al., "A Low Store Energy, Low VDDmin, Nonvolatile 8T2R SRAM with 3D Stacked RRAM Devices for Low Power Mobile Applications," IEEE VLSI Cir./Tech Symp., Jun. 2010, pp. 229-230.

Cho, Woo Yeong et al., "A 0.18um 3.0V 64Mb Non-Volatile Phase-Transition Random-Access Memory (PRAM)," ISSCC, Feb. 2004, Sec. 2-1.

Choi, Sang-Jun et al., "Improvement of CBRAM Resistance Window by Scaling Down Electrode Size in Pure-GeTe Film," IEEE Elec. Dev., vol. 30, No. 2, Feb. 2009, pp. 120-122.

Choi, Youngdon et al., "A 20nm 1.8V 8Gb PRAM with 40MB/s Program Bandwidth," IEEE ISSCC, 2012, pp. 46-47.

Chung, S. et al., "A 1.25um2 Cell 32Kb Electrical Fuse Memory in 32nm CMOS with 700mV Vddmin and Parallel/Serial Interface," VLSI Cir. Symp., Jun. 2009, pp. 30-31.

Chung, S. et al., "A 512x8 Electrical Fuse Memory with 15um2 Cells Using 8-sq Asymmetrical Fuse and Core Devices in 90nm CMOS," VLSI Cir. Symp., Jun. 2007, pp. 74-75.

Crowley, Matthew et al., "512Mb PROM with 8 Layers of Antifuse/Diode Cells," IEEE ISSCC 2003, Sec. 16.4.

De Sandre, Guido et al., "A 4Mb LV MOS-Selected Embedded Phase Change Memory in 90nm Standard CMOS Technology," IEEE J. Sol. Stat. Cir, vol. 46. No. 1, Jan. 2011, pp. 52-63.

De Sandre, Guido et al., "A 90nm 4Mb Embedded Phase-Change Memory with 1.2V 12ns Read Access Time and 1MB/s Write Throughput," ISSCC 2010, Sec. 14.7.

Desikan, Rajagopalan et al., "On-Chip MRAM as a High-Bandwidth Low-Latency Replacement for DRAM Physical Memories," Tech Report TR-02-47, Dept. of Computer Science, University of Texas, Austin, Sep. 27, 2002, 18 pages.

Dietrich, Stefan et al., "A Nonvolatile 2-Mbit CBRAM Memory Core Featuring Advanced Read and Program Control," IEEE J. of Solid-Stat Cir., vol. 42, No. 4, Apr. 2007, pp. 839-845.

Dion, Michael J., "Reservoir Modeling for Electromigration Improvement of Metal Systems with Refractory Barriers," IEEE 39th IRPS, 2001, pp. 327-333.

Doorn, T. S. et al., "Ultra-fast Programming of Silicided Polysilicon Fuses Based on New Insights in the Programming Physics," IEEE IEDM, 2005, pp. 667-670.

Doorn, T. S., "Detailed Qualitative Model for the Programming Physics of Silicided Polysilicon Fuses," IEEE Trans. on Elec. Dev. vol. 54, No. 12, Dec. 2007, pp. 3285-3291.

Durlam, M. et al., "A 1-Mbit MRAM Based on 1T1MTJ Bit Cell Integrated With Copper Interconnects," IEEE J. of Solid-State Circuits, vol. 38, No. 5, May 2003, pp. 769-773.

Engel, B. et al., "The Science and Technology of Magnetoresistive Tunnel Memory," IEEE Tran. on Nanotechnology, vol. 1, No. 1, Mar. 2002, pp. 32-38.

Engel, B.N. et al., "A 4Mb Toggle MRAM Based on a Novel bit and Switching Method," IEEE Trans. on Mag. vol. 41, No. 1, Jan. 2005, pp. 132-136.

Fellner, Johannes, et al., "Lifetime Study for a Poly Fuse in a 0.35um Polycide CMOS Process," IEEE 43rd IRPS, 2005, pp. 446-449.

Gao, B. et al., "Oxide-Based RRAM: Uniformity Improvement Using a New Material-Oriented Methodology," IEEE VLSI Tech. Symp., Jun. 2009, pp. 30-31.

Gao, B. et al., "Oxide-Based RRAM Switching Mechanism: A New Ion-Transport-Recombination Model," IEDM, Dec. 2008, pp. 563-566.

Gill, M. et al., "Ovonic Unified Memory—A High Performance Nonvolatile Memory Technology for Stand-Alone Memory and Embedded Applications," IEEE, ISSCC Dig. of Tech. Paper, Feb. 2002, pp. 202-203.

Gogl, D. et al., "A 16-Mb MRAM Featuring Bootstrapped Write Drivers," IEEE J. of Solid-State Circuits, vol. 40, No. 4, Apr. 2005, pp. 902-908.

Gopalan, C. et al., Demonstration of Conductive Bridging Random Access Memory (CBRAM) in Logic CMOS Process, IEEE Int. Memory Workshop, 2010, pp. 1-4.

Ha, Daewon and Kim, Kinam, "Recent Advances in High Density Phase Change Memory (PRAM)," IEEE VLSI Tech. Symp. Jun. 2007.

Hosoi, Y. et al., "High Speed Unipolar Switching Resistance RAM (RRAM) Technology," IEEE IEDM, Dec. 2006, pp. 1-4.

Hosomi, M. et al., "A Novel Nonvolatile Memory with Spin Torque Transfer Magnetization Switching: Spin-RAM," IEEE IEDM Dig. of Tech. Paper, Dec. 2005, pp. 459-463.

Huang, Chia-En et al., "A New CMOS Logic Anti-Fuse Cell with Programmable Contact," IEEE IEDM Tech. Dig. 2007, pp. 48-51.

Im, Jay et al., "Characterization of Silicided Polysilicon Fuse Implemented in 65nm CMOS Technology," 7th Annual Non-Volatile Memory Technology Symp, (NVMTS) 2006, pp. 55-57.

Jin, Li-Yan et al., "Low-Area 1-Kb Multi-Bit OTP IP Design," IEEE 8th Int. Conf. on ASIC (ASICON), 2009. pp. 629-632.

Johnson, Mark et al., "512Mb PROM with a Three-Dimensional Array of Diode/Antifuse Memory Cells," IEEE J. of Sol. Stat. Cir., vol. 38, No. 11, Nov. 2003, pp. 1920-1928.

Kalnitsy, Alexander et al., "CoSi2 Integrated Fuses on Poly Silicon for Low Voltage 0.18um CMOS Applications," IEEE IEDM 1999, pp. 765-768.

Kang, Han-Byul et al., "Electromigration of NiSi Poly Gated Electrical Fuse and Its Resistance Behaviors Induced by High Temperature," IEEE IRPS, 2010, pp. 265-270.

(56) References Cited

OTHER PUBLICATIONS

Kang, Sangbeom et al., "A 0.1um 1.8V 256Mb Phase-Change Random Access Memory (PRAM) with 66Mhz Synchronous Burst-Read," IEEE J. of Sol. Stat. Cir. vol. 42. No. 1, Jan. 2007, pp. 210-218.
Kawahara, T. et al., "2Mb Spin-Transfer Torque RAM (SPRAM) with Bit-by-Bit Bidirectional Current Write and Parallelizing-Direction Current Read," IEEE ISSCC Dig. of Tech. Paper, Feb. 2007, pp. 480-481.
Ker, Ming-Dou et al., "High-Current Characterization of Polysilicon Diode for Electrostatic Discharge Protection in Sub-Quarter-Micron Complementary Metal Oxide Semiconductor Technology," Jpn. J. Appl. Phys. vol. 42 (2003) pp. 3377-3378.
Ker, Ming-Dou et al., "Ultra-High-Voltage Charge Pump Circuit in Low-Voltage Bulk CMOS Processes With Polysilicon Diodes," IEEE Trans. on Cir. And Sys.-II: Exp. Brief., vol. 54, No. 1, Jan. 2007, pp. 47-51.
Kim, Deok-Kee et al., "An Investigation of Electrical Current Induced Phase Transitions in the NiPtSi/Polysilicon System," J. App. Phy. 103, 073708 (2008).
Kim, I. S. et al., "High Performance PRAM Cell Scalable to sub-20nm Technology with below 4F2 Cell Size, Extendable to DRAM Applications," IEEE VLSI Tech Symp., Jun. 2010, pp. 203-204.
Kim, Jinbong et al., "3-Transistor Antifuse OTP ROM Array Using Standard CMOS Process," IEEE VLSI Cir. Symposium, Jun. 2003, pp. 239-242.
Kim, O. et al., "CMOS trimming circuit based on polysilicon fusing," Elec. Lett. vol. 34, No. 4, pp. 355-356, Feb. 1998.
Klee, V. et al., "A 0.13um Logic-Based Embedded DRAM Technology with Electrical Fuses, Cu Interconnect in SiLK, sub-7ns Random Access Time and its Extension to the 0.10um Generation," IEEE IEDM, 2001, pp. 407-410.
Kothandaramam, C. et al., "Electrically programmable fuse (eFUSE) using electromigration in silicides," IEEE Elec. Dev. Lett., vol. 23, No. 9, pp. 523-525, Sep. 2002.
Kulkarni, S. et al., "High-Density 3-D Metal-Fuse PROM Featuring 1.37um2 1T1R Bit Cell in 32nm High-K Metal-Gate CMOS Technology," VLSI Cir. Symp., Jun. 2009 pp. 28-29.
Kulkarni, S. et al., "A 4Kb Metal-Fuse OTP-ROM Macro Featuring a 2V Programmable 1.37um2 1T1R Bit Cell in 32nm High-K Metal-Gate CMOS," IEEE J. of Sol. Stat. Cir, vol. 45, No. 4, Apr. 2010, pp. 863-868.
Kund, Michael et al., "Conductive Bridging RAM (CBRAM): An Emerging Non-Volatile Memory Technology Scalable to Sub 20nm," IEEE IEDM 2005, pp. 754-757.
Lai, Han-Chao et al., "A 0.26um2 U-Shaped Nitride-Based Programming Cell on Pure 90nm CMOS Technology," IEEE Elec. Dev. Lett. vol. 28, No. 9, Sep. 2007, pp. 837-839.
Lai, S., "Current Status of the Phase Change Memory and Its Future," IEEE IEDM Dig. of Tech. Paper, Dec. 2003, pp. 255-258.
Lee, H. Y. et al., "Low Power and High Speed Bipolar Switching with A Thin Reactive Ti Buffer Layer in Robust HfO2 Based RRAM," IEEE IEDM, 2008, pp. 1-4.
Lee, K.J., et al., "A 90nm 1.8V 512Mb Diode-Switch PRAM with 266MB/s Read Throughout," IEEE ISSCC, Dig. of Tech. Paper, Feb. 2007, 3 pgs.
Lee, Kwang-Jin et al., "A 90nm 1.8V 512Mb Diode-Switch PRAM with 266MB/s Read Throughput," IEEE J. of Sol. Stat. Cir., vol. 43, No. 1, Jan. 2008, pp. 150-162.
Lee, M.-J. et al., "Stack Friendly all-Oxide 3D RRAM Using GaInZnO Peripheral TFT Realized Over Glass Substrates," IEDM, Dec. 2008. pp. 1-4.
Lee, Man Chiu et al., "OTP Memory for Low Cost Passive RFID Tags," IEEE Conf. on Electron Devices and Solid-State Circuits (EDSSC), 2007, pp. 633-636.
Liaw, Corvin et al., "The Conductive Bridging Random Access Memory (CBRAM): A Non-volatile Multi-Level Memory Technology," 37th European Solid-State Device Research Conference (ESSDERC), 2007, pp. 226-229.

Lim, Kyunam et al., "Bit Line Coupling Scheme and Electrical Fuse Circuit for Reliable Operation of High Density DRAM," IEEE VLSI Cir. Symp. Jun. 2001, pp. 33-34.
Maffitt, T. et al., "Design Considerations for MRAM," IBM J. Res. & Dev., vol. 50, No. 1, Jan. 2006, pp. 25-39.
Meng, X.Z. et al., "Reliability Concept for Electrical Fuses," IEE Proc.-Sci Meas. Technol., vol. 144, No. 2, Mar. 1997, pp. 87-92.
Min, Byung-Jun et al., "An Embedded Non-volatile FRAM with Electrical Fuse Repair Scheme and One Time Programming Scheme for High Performance Smart Cards," IEEE CICC, Nov. 2005, pp. 255-258.
Mojumder, N. N. et al., "Three-Terminal Dual-Pillar STT-MRAM for High Performance Robust Memory Applications," IEEE Trans. Elec. Dev. vol. 58. No. 5, May 2011, pp. 1508-1516.
Morimoto, T. et al., "A NiSi Salicide Technology for Advanced Logic Devices," IEEE IEDM, Dec. 1991, pp. 653-656.
Neale, Ron, "PCM Progress Report No. 6 Afterthoughts," http://www.eetimes.com/General/PrintView/4236240, Feb. 13, 2012, 5 pages.
Nebashi, R. et al., "A 90nm 12ns 32Mb 2T1MTJ MRAM," IEEE ISSCC Dig. of Tech. Paper, Sess. 27.4, Feb. 2009, 3 pages.
Ng, K.P. et al., "Diode-Base Gate Oxide Anti-Fuse One-Time Programmable Memory Array in Standard CMOS Process," IEEE Int. Conf. of Elect. Dev. & Solid-Stat Cir. (EDSSC), Dec. 2009, pp. 457-460.
Ohbayashi, Shigeki et al., "A 65nm Embedded SRAM With Wafer Level Burn-In Mode, Leak-Bit Redundancy and Cu E-Trim Fuse for Known Good Die," IEEE J. of Solid. Stat. Cir., vol. 43, No. 1, Jan. 2008, pp. 96-108.
Oh, G. H. et al., "Parallel Multi-Confined (PMC) Cell Technology for High Density MLC PRAM," IEEE VLSI Tech. Symp., Jun. 2009, pp. 220-221.
Oh, J. H. et al., "Full Integration of Highly Manufacturable 512Mb PRAM Based on 90nm Technology," IEEE IEDM Dig. of Tech. Paper, Dec. 2006, pp. 1-4.
Osada, K. et al., "Phase Change RAM Operated with 1.5V CMOS as Low Cost Embedded Memory," IEEE CICC, Nov. 2005, pp. 431-434.
Park, Don et al., "Study on Reliability of Metal Fuse for Sub-100nm Technology," IEEE Int. Symp. On Semiconductor Manufacturing (ISSM), 2005, pp. 420-421.
Park, Jongwoo et al., "Phase Transformation of Programmed NiSi Electrical Fuse: Diffusion, Agglomeration, and Thermal Stability," 18th IEEE Int. Symp. On Physical and Failure Analysis of Integrated Circuits, (IPFA), 2011, pp. 1-7.
Park, Young-Bae et al., "Design of an eFuse OTP Memory of 8 Bits Based on a 0.35um BCD Process," Mobile IT Convergence (ICMIC), 2011 Int. Conf. on, pp. 137-139.
Pellizzer, F. et al., "Novel uTrench Phase-Change Memory Cell for Embedded and Stand-alone Non-Volatile Memory Applications," IEEE VLSI Tech Symp. Jun. 2004, pp. 18-19.
Peng, J. et al., "A Novel Embedded OTP NVM Using Standard Foundry CMOS Logic Technology," IEEE 21st Non-Volatile Semiconductor Memory Workshop (NVSMW) 2006, pp. 24-26.
Rizzolo, R. F. et al., "IBM System z9 eFUSE applications and methodology," IBM J. Res. & Dev. vol. 51 No. ½ Jan./Mar. 2007, pp. 65-75.
Robson, Norm et al., "Electrically Programmable Fuse (eFuse) from Memory Redundancy to Autonomic Chips," IEEE CICC, 2007, pp. 799-804.
Russo, U. et al., "Conductive-Filament Switching Analysis and Self-Accelerated Thermal Dissolution Model for Reset in NiO-based RRAM," IEDM, Dec. 2007, pp. 775-778.
Safran, J. et al., "A Compact eFUSE Programmable Array Memory for SOI CMOS," VLSI Cir. Symp. Jun. 2007, pp. 72-73.
Sasaki, Takahiko et al., "Metal-Segregate-Quench Programming of Electrical Fuse," IEEE 43rd IRPS, 2005, pp. 347-351.
Schrogmeier, P. et al., "Time Discrete Voltage Sensing and Iterative Programming Control for a 4F2 Multilevel CBRAM," VLSI Cir. Symp., Jun. 2007, pp. 186-187.
Sheu, Shyh-Shyuan et al., "A 5ns Fast Write Multi-Level Non-Volatile 1K-bits RRAM Memory with Advance Write Scheme," VLSI Cir. Symp., Jun. 2009, pp. 82-83.

(56) References Cited

OTHER PUBLICATIONS

Sheu, Shyh-Shyuan et al., "Fast-Write Resistive RAM (RRAM) for Embedded Applications," IEEE Design & Test of Computers, Jan./Feb. 2011, pp. 64-71.
Shi, Min et al., "Zero-Mask Contact Fuse for One-Time-Programmable Memory in Standard CMOS Processes," IEEE Dev. Lett. vol. 32, No. 7, Jul. 2011, pp. 955-957.
Song, Y. J. et al., "Highly Reliable 256Mb PRAM with Advanced Ring Contact Technology and Novel Encapsulating Technology," IEEE VLSI Tech Symp., Jun. 2006, pp. 153-154.
Suto, Hiroyuki et al., "Programming Conditions for Silicided Poly-Si or Copper Electrically Programmable Fuses," IEEE IIRW Final Report, 2007, pp. 84-89.
Suto, Hiroyuki et al., "Study of Electrically Programmable Fuses Through Series of I-V Measurements," IEEE IIRW Final Report, 2006, pp. 83-86.
Suto, Hiroyuki et al., "Systematic Study of the Dopant-Dependent Properties of Electrically Programmable Fuses With Silicide Poly-Si Links Through a Series of I-V Measurements," IEEE Trans. on Dev. Mat. Rel. vol. 7, No. 2, Jun. 2007, pp. 285-297.
Takaoka, H. et al., A Novel Via-fuse Technology Featuring Highly Stable Blow Operation with Large On-off Ratio for 32nm Node and Beyond, IEDM, 2007, pp. 43-46.
Tehrani, S. et al., "Magnetoresistive Random Access Memory Using Magnetic Tunnel Junction," Proc. of IEEE, vol. 91, No. 5, May 2003, pp. 703-714.
Tehrani, S., "Status and Outlook of MRAM Memory Technology," IEEE IEDM Dig. of Tech Paper., Dec. 2006, pp. 1-4.
Teichmann, J. et al., "One Time Programming (OTP) with Zener Diodes in CMOS Processes," 33rd Conf. on European Solid-State Device Research (ESSDERC), 2003, pp. 433-436.
Tian, C. et al., "Reliability Investigation of NiPtSi Electrical Fuse with Different Programming Mechanisms," IEEE IIRW Final Report, 2007, pp. 90-93.
Tian, C. et al., "Reliability Qualification of CoSi2 Electrical Fuse for 90nm Technology," IEEE 44th IRPS, 2006, pp. 392-397.
Tian, Chunyan et al., "Reliability Investigation of NiPtSi Electrical Fuse with Different Programming Mechanisms," IEEE Trans. on Dev. Mat. Rel. vol. 8, No. 3, Sep. 2008, pp. 536-542.
Tonti, W. R. et al., "Product Specific Sub-Micron E-Fuse Reliability and Design Qualification," IEEE IIRW Final Report, 2003, pp. 36-40.
Tonti, W. R., "Reliability and Design Qualification of A Sub-Micro Tungsten Silicide E-Fuse," IEEE IRPS Proceedings, 2004, pp. 152-156.
Tonti, W. R., "Reliability, Design Qualification, and Prognostic Opportunity of in Die E-Fuse," IEEE Conference on Prognostics and Health Management (PHM), 2011, pp. 1-7.
Ueda, T. et al., "A Novel Cu Electrical Fuse Structure and Blowing Scheme utilizing Crack-assisted Mode for 90-45nm-node and beyond," IEEE VLSI Tech. Sym., Jun. 2006, 2 pages.
Ulman, G. et al., "A Commercial Field-Programmable Dense eFUSE Array Memory with 00.999% Sense Yield for 45nm SOI CMOS", ISSCC 2008/ Session 22 / Variation Compensation and Measurement/ 22.4, 2008 IEEE International Solid-State Circuits Conference, pp. 406-407.
Vimercati, Daniele et al., "A 45nm 1Gbit 1.8V PCM for Wireless and Embedded Applications," IEEE ISSCC Feb. 2010, 26 pages.
Vinson, J. E., "NiCr Fuse Reliability—A New Approach," Southcon/ 94, Conference Record, 1994, pp. 250-255.
Walko, J., "Ovshinsky's Memories," IEE Review, Issue 11, Nov. 2005, pp. 42-45.
Wang, J. P. et al., "The Understanding of Resistive Switching Mechansim in HfO2-Based Resistive Random Access Memory," IEDM, 2011, pp. 12.1.1-12.1.4.
Wikipedia, "Programmable read-only memory", http://en.wikipedia.org/wiki/Programmable_read-only_memory, downloaded Jan. 31, 2010, 4 pages.
Worledge, D.C., "Single-Domain Model for Toggle MRAM," IBM J. Res. & Dev. vol. 50, No. 1, Jan. 2006, pp. 69-79.
Wu, Kuei-Sheng et al., "The Improvement of Electrical Programmable Fuse with Salicide-Block Dielectrical Film in 40nm CMOS Technology," Interconnect Technology Conference (IITC), 2010 Int. pp. 1-3.
Wu, Kuei-Sheng et al., "Investigation of Electrical Programmable Metal Fuse in 28nm and beyond CMOS Technology," IEEE International Interconnect Technology Conference and 2011 Materials for Advanced Metallization (IITC/MAM), 2011, pp. 1-3.
Yin, M. et al., "Enhancement of Endurance for CuxO based RRAM Cell," 9th Int. Conf. on Solid-State and Integrated-Circuit Technology (ICSICT) 2008, pp. 917-920.
Zhu, Jian-Gang, "Magnetoresistive Random Access Memory: The Path to Competitiveness and Scalability," Proc. Of IEEE, vol. 96, No. 11, Nov. 2008, pp. 1786-1798.
Zhuang, W. W. et al., "Novell Colossal Magnetonresistive Thin Film Nonvolatile Resistance Random Access Memory (RRAM)," IEEE IEDM 2002, pp. 193-196.
Notice of Allowance for U.S. Appl. No. 13/026,664 dated Sep. 18, 2012.
Office Action for U.S. Appl. No. 13/471,704 dated Jul. 31, 2012.
Notice of Allowance for U.S. Appl. No. 13/471,704 dated Oct. 18, 2012.
Notice of Allowance for U.S. Appl. No. 13/026,678 dated Sep. 19, 2012.
Office Action for U.S. Appl. No. 13/026,783 dated Sep. 27, 2012.
Office Action for U.S. Appl. No. 13/026,717 dated Oct. 25, 2012.
Office Action for U.S. Appl. No. 13/026,650 dated Nov. 9, 2012.
Office Action for U.S. Appl. No. 13/026,692 dated Nov. 9, 2012.
Office Action for U.S. Appl. No. 13/026,752 dated Nov. 9, 2012.
Office Action for U.S. Appl. No. 13/026,656 dated Nov. 13, 2012.
Office Action for U.S. Appl. No. 13/026,704 dated Nov. 23, 2012.
Office Action for U.S. Appl. No. 13/397,673, dated Dec. 18, 2012.
Office Action for U.S. Appl. No. 13/026,840, dated Dec. 31, 2012.
Office Action for U.S. Appl. No. 13/026,852, dated Jan. 14, 2013.
Restriction Requirement for U.S. Appl. No. 13/026,835, dated Dec. 12, 2012.
Notice of Allowance for U.S. Appl. No. 13/026,717, dated Feb. 12, 2013.
Office Action for U.S. Appl. No. 13/471,704, dated Jan. 25, 2013.
U.S. Appl. No. 13/761,048, filed Feb. 6, 2013.
U.S. Appl. No. 13/761,057, filed Feb. 6, 2013.
U.S. Appl. No. 13/761,097, filed Feb. 6, 2013.
U.S. Appl. No. 13/761,045, filed Feb. 6, 2013.
Office Action for U.S. Appl. No. 13/026,678, dated Feb. 20, 2013.
Notice of Allowance for U.S. Appl. No. 13/026,783, dated Mar. 4, 2013.
Notice of Allowance for U.S. Appl. No. 13/026,692, dated Mar. 15, 2013.
Notice of Allowance for U.S. Appl. No. 13/026,835, dated Mar. 20, 2013.
Notice of Allowance for U.S. Appl. No. 13/026,664, dated Apr. 22, 2013.
Notice of Allowance for U.S. Appl. No. 13/026,656, dated Apr. 22, 2013.
Jagasivamani et al., "Development of a Low-Power SRAM Compiler", IEEE Press, 2001, pp. 498-501.
Liu et al., "A Flexible Embedded SRAM Compiler", IEEE Press, 2002, 3 pgs.
Sundrararajan, "OSUSPRAM: Design of a Single Port SRAM Compiler in NCSU FREEPDK45 Process", Mater of Science in Electrical Engineering, Oklahoma State University, Jul. 2010, 117 pgs.
Notice of Allowance for U.S. Appl. No. 13/026,835, dated Apr. 18, 2013.
Notice of Allowance for U.S. Appl. No. 13/026,704, dated Apr. 30, 2013.
Notice of Allowance for U.S. Appl. No. 13/026,852, dated May 10, 2013.
Notice of Allowance for U.S. Appl. No. 13/026,717, dated May 15, 2013.
Notice of Allowance for U.S. Appl. No. 13/471,704, dated May 22, 2013.

(56) References Cited

OTHER PUBLICATIONS

Notice of Allowance for U.S. Appl. No. 13/026,678, dated May 28, 2013.
Notice of Allowance for U.S. Appl. No. 13/026,650, dated May 30, 2013.
Restriction Requirement for U.S. Appl. No. 13/314,444, dated Jun. 7, 2013.
Restriction Requirement for U.S. Appl. No. 13/214,198, dated Jun. 13, 2013.
Notice of Allowance for U.S. Appl. No. 13/026,840, dated Jun. 13, 2013.
Restriction Requirement for U.S. Appl. No. 13/026,771, dated Jun. 13, 2013.
Notice of Allowance for U.S. Appl. No. 13/026,752, dated Jul. 1, 2013.
Restriction Requirement for U.S. Appl. No. 13/678,543, dated Jul. 8, 2013.
Office Action for U.S. Appl. No. 13/026,725, dated Jul. 19, 2013.
Notice of Allowance for U.S. Appl. No. 13/026,664, dated Jul. 22, 2013.
Notice of Allowance for U.S. Appl. No. 13/026,692, dated Jul. 23, 2013.
Notice of Allowance for U.S. Appl. No. 13/397,673, dated Jul. 30, 2013.
Notice of Allowance for U.S. Appl. No. 13/026,704, dated Aug. 2, 2013.
Notice of Allowance for U.S. Appl. No. 13/026,783, dated Aug. 5, 2013.
Office Action for U.S. Appl. No. 13/214,198, dated Aug. 6, 2013.
Office action for Chinese Patent Application No. 201110279954.7, dated Jul. 1, 2013.
Shen et al., "High-K Metal Gate Contact RRAM (CRRAM) in Pure 28 nm CMOS Logic Process", Electron Devices Meeting (IEDM), 2012 IEEE International, Dec. 2012, 4 pgs.
Tseng et al., "A New High-Density and Ultrasmall-Cell Size Contact RRAM (CR-RAM) with Fully CMOS-Logic-Compatible Technology and Circuits", IEEE Transactions on Electron Devices, vol. 58, Issue 1, Jan. 2011, 6 pgs.
Office Action for U.S. Appl. No. 13/026,783, dated Sep. 9, 2013.
Office Action for U.S. Appl. No. 13/314,444, dated Sep. 9, 2013.
Office Action for U.S. Appl. No. 13/026,771, dated Sep. 9, 2013.
Notice of Allowance for U.S. Appl. No. 13/026,852, dated Sep. 18, 2013.
Office Action (Ex Parte) for U.S. Appl. No. 13/678,543, dated Sep. 20, 2013.
Office Action for UU.S. Appl. No. 13/835,308, dated Sep. 27, 2013.
Notice of Allowance for U.S. Appl. No. 13/026,717, dated Oct. 1, 2013.
Office Action for U.S. Appl. No. 13/954,831, dated Oct. 1, 2013.
Notice of Allowance for U.S. Appl. No. 13/026,656, dated Oct. 4, 2013.
Office Action for U.S. Appl. No. 13/214,183, dated Oct. 25, 2013.
Chua, "Many Times Programmable z8 Microcontroller", e-Gizmo.cim, Nov. 21, 2006, pp. 1-5.
Forum, Intel Multi-byte Nops, asmcommunity.net, Nov. 21, 2006, pp. 1-5.
CMOS Z8 OTP Microcontrollers Product Specification, Zilog Inc., May 2008, Revision 1, pp. 1-84.
OTP Programming Adapter Product User Guide, Zilog Inc., 2006, pp. 1-3.
Notice of Allowance for U.S. Appl. No. 13/026,852, dated Nov. 15, 2013.
Notice of Allowance for U.S. Appl. No. 13/026,835, dated Nov. 22, 2013.
Notice of Allowance for U.S. Appl. No. 13/026,725, dated Dec. 10, 2013.
Office Action for U.S. Appl. No. 13/026,783, dated Dec. 23, 2013.
Notice of Allowance for U.S. Appl. No. 13/026,771, dated Jan. 15, 2014.
Office Action for Chinese Patent Application No. 201110244362.1, dated Sep. 29, 2013.
Office Action for Chinese Patent Application No. 201110235464.7, dated Oct. 8, 2013.
Office Action for Chinese Patent Application No. 201110244400.3, dated Nov. 5, 2013.
Office Action for Chinese Patent Application No. 201110244342.4, dated Oct. 31, 2013.
Restriction Requirement for U.S. Appl. No. 13/678,541, dated Feb. 28, 2014.
Notice of Allowance for U.S. Appl. No. 13/026,840, dated Mar. 6, 2014.
Notice of Allowance for U.S. Appl. No. 13/026,840, dated Mar. 10, 2014.
Notice of Allowance of U.S. Appl. No. 13/678,543, dated Dec. 13, 2013.
Notice of Allowance for U.S. Appl. No. 13/835,308, dated Mar. 14, 2014.
Notice of Allowance for U.S. Appl. No. 13/026,835, dated Mar. 14, 2014.
Notice of Allowance for U.S. Appl. No. 13/026,725, dated Mar. 31, 2014.
Notice of Allowance for U.S. Appl. No. 13/026,852, dated Mar. 20, 2014.
Notice of Allowance for U.S. Appl. No. 13/026,771, dated Mar. 18, 2014.
Final Office Action for U.S. Appl. No. 13/214,183, dated Apr. 17, 2014.
"Embedded Systems/Mixed C and Assembly Programming", Wikibooks, Aug. 6, 2009, pp. 1-7.
Notice of Allowance for U.S. Appl. No. 13/761,097, dated Jul. 15, 2014.
Office Action for U.S. Appl. No. 13/571,797, dated Apr. 24, 2014.
Notice of Allowance for U.S. Appl. No. 13/590,044, dated Apr. 29, 2014.
Notice of Allowance for U.S. Appl. No. 13/954,831, dated May 27, 2014.
Notice of Allowance of U.S. Appl. No. 13/833,044, dated May 29, 2014.
Notice of Allowance for U.S. Appl. No. 13/761,048, dated Jun. 10, 2014.
Office Action for Taiwanese Patent Application No. 100129642, dated May 19, 2014 (with translation).
Office Action for U.S. Appl. No. 13/072,783, dated Nov. 7, 2013.
Notice of Allowance for U.S. Appl. No. 13/026,840, dated Jun. 24, 2014.
Notice of Allowance for U.S. Appl. No. 13/214,198, dated Jun. 23, 2014.
Notice of Allowance for U.S. Appl. No. 13/590,044, dated Jun. 23, 2014.
Ker et al., "MOS-bounded diodes for on-chip ESD protection in a 0.15-μ m shallow-trench-isolation salicided CMOS Process" International Symposium on VLSI Technology, Systems and Applications, 2003, 5 pgs.
Notice of Allowance for U.S. Appl. No. 13/840,965, dated Jun. 25, 2014.
Office Action for U.S. Appl. No. 13/970,562, dated Jun. 27, 2014.
Office Action for U.S. Appl. No. 13/835,308, dated Jun. 27, 2014.
Notice of Allowance for U.S. Appl. No. 13/288,843, dated Jul. 8, 2014.
Restriction Requirement for U.S. Appl. No. 13/678,539, dated Jul. 1, 2014.
Notice of Allowance for U.S. Appl. No. 14/231,413, dated Jul. 18, 2014.
Notice of Allowance for U.S. Appl. No. 13/590,044, dated Jul. 23, 2014.
Restriction Requirement for U.S. Appl. No. 13/833,067, dated Jul. 11, 2014.
Notice of Allowance for U.S. Appl. No. 13/954,831, dated Aug. 4, 2014.
Restriction Requirement for U.S. Appl. No. 13/678,544, dated Aug. 1, 2014.

(56) References Cited

OTHER PUBLICATIONS

Notice of Allowance for U.S. Appl. No. 13/761,097, dated Jul. 25, 2014.
Ex parte Quayle for U.S. Appl. No. 13/761,057, dated Aug. 8, 2014.
Final Office Action for U.S. Appl. No. 13/314,444, dated May 14, 2014.
Corrected Notice of Allowability for U.S. Appl. No. 13/288,843, dated Aug. 19, 2014.
Office Action for U.S. Appl. No. 13/590,049, dated Aug. 29, 2014.
Ex Parte Quayle for U.S. Appl. No. 13/590,047, dated Aug. 29, 2014.
Ex Parte Quayle for U.S. Appl. No. 13/590,050, dated Sep. 3, 2014.
Office Action for U.S. Appl. No. 13/678,544, dated Sep. 12, 2014.
Office Action for U.S. Appl. No. 13/678,539, dated Sep. 10, 2014.
Notice of Allowance for U.S. Appl. No. 13/288,843, dated Sep. 18, 2014.
Notice of Allowance for U.S. Appl. No. 13/761,057, dated Sep. 26, 2014.
Notice of Allowance for U.S. Appl. No. 13/833,044, dated Sep. 24, 2014.
Notice of Allowance for U.S. Appl. No. 13/314,444, dated Sep. 24, 2014.
Office Action for U.S. Appl. No. 13/761,045, dated Sep. 30, 2014.
Notice of Allowance for U.S. Appl. No. 13/835,308, dated Oct. 10, 2014.
Notice of Allowance for U.S. Appl. No. 13/571,797, dated Oct. 14, 2014.
Office Action for U.S. Appl. No. 13/833,067, dated Oct. 20, 2014.
Notice ofAllowance for U.S. Appl. No. 14/085,228, dated Oct. 23, 2014.
Office Action for U.S. Appl. No. 13/842,824, dated Oct. 29, 2014.
Herner et al., "Vertical p-i-n Polysilicon Diode with Antifuse for stackable Field-Programmable ROM", IEEE Electron Device Letters, vol. 25, No. 5, pp. 271-273, May 2004.
Notice of Allowance for U.S. Appl. No. 13/590,049, dated Nov. 25, 2014.
Notice of Allowance for U.S. Appl. No. 13/590,047, dated Nov. 24, 2014.
Office Action for U.S. Appl. No. 13/590,044, dated Dec. 9, 2014.
Notice of Allowance for U.S. Appl. No. 13/590,050, dated Dec. 18, 2014.
Office Action for U.S. Appl. No. 14/042,392, dated Dec. 31, 2014.
Office Action for U.S. Appl. No. 14/071,957, dated Dec. 29, 2014.
International Search Report and Written Opinion for International Patent Application No. PCT/US/2014/056676, dated Dec. 19, 2014.
Office Action for U.S. Appl. No. 14/493,083, dated Jan. 8, 2015.
Office Action for Chinese Patent Application No. 2011102443903, dated Dec. 16, 2014 (with translation).
Notice of Allowance for U.S. Appl. No. 13/970,562, dated Jan. 23, 2015.
Notice of Allowance for U.S. Appl. No. 14/493,069, dated Feb. 17, 2015.
Notice of Allowance for U.S. Appl. No. 14/085,228, dated Feb. 18, 2015.
Notice of Allowance for U.S. Appl. No. 13/761,045, dated Feb. 18, 2015.
Notice of Allowance for U.S. Appl. No. 14/231,404, dated Jan. 22, 2015.
Notice of Allowance for U.S. Appl. No. 14/021,990, dated Dec. 9, 2014.
Final Office Action for U.S. Appl. No. 13/678,544, dated Feb. 15, 2015.
Office Action for U.S. Appl. No. 14/101,125, dated Mar. 6, 2015.
Hassan, "Argument for anti-fuse non-volatile memory in 28nm high-k metal gate", Feb. 15, 2011, www1.eeetimes.com publication.
Office Action for U.S. Appl. No. 13/026,783, dated Mar. 5, 2015.
Final Office Action for U.S. Appl. No. 13/678,539, dated Apr. 1, 2015.
Office Action for U.S. Appl. No. 14/636,155, dated Apr. 10, 2015.
Notice of Allowance for U.S. Appl. No. 14/021,990, dated Apr. 14, 2015.
Notice of Allowance for U.S. Appl. No. 13,842,824, dated Apr. 14, 2015.
Notice of Allowance for U.S. Appl. No. 14/071,957, dated Apr. 14, 2014.
Notice of Allowance for U.S. Appl. No. 14/231,404, dated Apr. 17, 2015.
Notice of Allowance for U.S. Appl. No. 13/590,444, dated May 12, 2015.
Notice of Allowance for U.S. Appl. No. 13/072,783, dated May 13, 2015.
Notice of Allowance for U.S. Appl. No. 13,833,067, dated Jun. 5, 2015.
Office Action for U.S. Appl. No. 13/314,444, dated Dec. 10, 2014.
Final Office Action for U.S. Appl. No. 13/026,783, dated Jul. 30, 2015.
Notice of Allowance for U.S. Appl. No. 14/553,874, dated Aug. 10, 2015.
Office Action for U.S. Appl. No. 14/500,743, dated Aug. 17, 2015.
Notice of Allowance for U.S. Appl. No. 14/042,392, dated Aug. 21, 2015.
Office Action for U.S. Appl. No. 14/485,696, dated Aug. 20, 2015.
Notice of Allowance for U.S. Appl. No. 14/493,083, dated Aug. 27, 2015.
Office Action for U.S. Appl. No. 13/678,539, dated Sep. 16, 2015.
Office Action for U.S. Appl. No. 14/507,691, dated Oct. 30, 2015.
Final Office Action for U.S. Appl. No. 14/101,125, dated Nov. 17, 2015.
Notice of Allowance for U.S. Appl. No. 13/072,783, dated Oct. 27, 2015.
Office Action for U.S. Appl. No. 14/792,479, dated Aug. 28, 2015.
Notice of Allowance for U.S. Appl. No. 14/500,743, dated Dec. 2, 2015.
Notice of Allowance for U.S. Appl. No. 14/636,155, dated Dec. 4, 2015.
Notice of Allowance for U.S. Appl. No. 14/071,957, dated Dec. 4, 2015.
Notice of Allowance for U.S. Appl. No. 13/678,544, dated Feb. 12, 2016.
Office Action for U.S. Appl. No. 14/749,392, dated Feb. 25, 2016.
Office Action for U.S. Appl. No. 14/940,012, dated Feb. 26, 2016.
Notice of Allowance for U.S. Appl. No. 14/485,698, dated Mar. 1, 2016.
Notice of Allowance for U.S. Appl. No. 14/507,691, dated Mar. 15, 2016.
Final Office Action for U.S. Appl. No. 13/314,444, dated Dec. 8, 2011.
Final Office Action for U.S. Appl. No. 13/678,539, dated Apr. 8, 2016.
Notice of Allowance for U.S. Appl. No. 14/545,775, dated Apr. 12, 2016.
Final Office Action for U.S. Appl. No. 14/101,125, dated Apr. 21, 2016.
Notice of Allowance for U.S. Appl. No. 14/500,743, dated Apr. 26, 2016.
Notice of Allowance for U.S. Appl. No. 14/749,392, dated Jun. 27, 2016.
Notice of Allowance for U.S. Appl. No. 14/940,012, dated Jul. 15, 2016.
Office Action for U.S. Appl. No. 14/985,095, dated Jul. 21, 2016.
Notice of Allowance for U.S. Appl. No. 13/314,444, dated Aug. 5, 2016.
Notice of Allowance for U.S. Appl. No. 14/485,696, dated Sep. 21, 2016.
Notice of Allowance for U.S. Appl. No. 15,076,460, dated Dec. 5, 2016.
Final Office Action for U.S. Appl. No. 14/101,125, dated Dec. 14, 2016.
Office Action for U.S. Appl. No. 15/297,922, dated Dec. 23, 2016.
Office Action for U.S. Appl. No. 15/270,287, dated Dec. 23, 2016.
Final Office Action for U.S. Appl. No. 13/678,539, dated Feb. 8, 2017.

(56) References Cited

OTHER PUBLICATIONS

Notice of Allowance for U.S. Appl. No. 15/076,460, dated Mar. 15, 2017.
Office Action for U.S. Appl. No. 15/422,266, dated Mar. 17, 2017.
Office Action for U.S. Appl. No. 15/365,584, dated Apr. 21, 2017.
Notice of Allowance for U.S. Appl. No. 14/485,696, dated May 25, 2017.
Notice of Allowance for U.S. Appl. No. 14/101,125, dated Jul. 10, 2017.
Notice of Allowance for U.S. Appl. No. 15/076,460, dated Jul. 20, 2017.
Final Office Action for U.S. Appl. No. 14/485,698, dated Jul. 24, 2017.
Renewed Final Office Action for U.S. Appl. No. 14/485,698, dated Aug. 2, 2017.
Office Action for Taiwanese Patent Application No. 102145000, dated Jul. 7, 2017. (with translations).
Office Action for Chinese Patent Application No. 102610272 A, dated Jul. 10, 2017. (with translations).
Final Office Action for U.S. Appl. No. 15/422,266, dated Sep. 12, 2017.
Notice of Allowance for U.S. Appl. No. 15/365,584, dated Sep. 13, 2017.
Notice of Allowance for U.S. Appl. No. 14/485,698, dated Oct. 16, 2017.
Final Office Action for U.S. Appl. No. 15/422,266, dated Jan. 22, 2018.
Notice of Allowance for U.S. Appl. No. 14/485,698, dated Feb. 15, 2018.
Extended Search Report for EP Application No. 14901820, dated Jun. 23, 2017.
Office Action for U.S. Appl. No. 15/884,362, dated May 4, 2018.
Extended European Search Report for EP Application No. 18151106.4, dated Apr. 6, 2018.
Tonti, "Reliability, design qualification, and prognostic opportunity of in due E-Fuse" Prognostics and Heath Management IEEE Conference Jun. 20, 2011, pp. 1-7.
Office Action for U.S. Appl. No. 15/805,109, dated May 29, 2018.
Office Action for U.S. Appl. No. 14/485,698, dated Jun. 21, 2018.
Notice of Allowance for U.S. Appl. No. 15/884,362 dated Sep. 19, 2018.
Notice of Allowance for U.S. Appl. No. 15/708,116 dated Oct. 26, 2018.
Notice of Allowance for U.S. Appl. No. 14/485,698 dated Dec. 10, 2018.
Office Action for U.S. Appl. No. 15/953,422, dated Jan. 28, 2019.
Office Action for U.S. Appl. No. 15/805,109, dated Jun. 26, 2019.
Office Action for U.S. Appl. No. 16/245,223, dated Aug. 8, 2019.

* cited by examiner

LOW POWER READ OPERATION FOR PROGRAMMABLE RESISTIVE MEMORIES

CROSS-REFERENCE TO RELATED APPLICATION

This application claims priority benefit of U.S. Provisional Patent Application No. 62/485,895, filed on Apr. 14, 2017 and entitled "CIRCUIT AND SYSTEM OF ULTRA LOW VOLTAGE AND LOW CURRENT READ FOR PROGRAMMABLE RESISTIVE MEMORIES," which is hereby incorporated herein by reference.

BACKGROUND OF THE INVENTION

Field of the Invention

The present invention relates to a sensing circuit for converting resistance in programmable resistive devices into logic states. The programmable resistive device memories are OTP, MTP, PCRAM, FeRAM, RRAM, and MRAM, etc.

Description of the Related Art

A Programmable Resistive Device (PRD) is generally referred to a device whose resistance can be changed by means of programming. Resistance states can also be determined by resistance values. For example, a programmable resistive device can be a One-Time Programmable (OTP) device, such as electrical fuse (or anti-fuse), and the programming means can apply a high voltage to induce a high current to flow through the OTP element. When a high current flows through an OTP element (e.g., by turning on a selector), the OTP element can be programmed, or burned into a high or low resistance state (depending on either fuse or anti-fuse).

FIG. 1 shows a schematic diagram of a conventional Programmable Resistive Device (PRD) 10 that has a Programmable Resistive Element (PRE) 11 and a selector 12. The PRE 11 can be an electrical fuse, anti-fuse, floating-gate device, phase-change material, resistive RAM element, or Magnetic Tunnel Junction (MTJ), etc. The selector 12 can be MOS, diode, MOS/diode merged, or even bipolar device that can be turned on or turned off by asserting a signal Sel.

The resistance of a PRE in a PRD device needs to be converted into a logic level after reading the PRD cell. This can be achieved by using a sensing circuit or sense amplifier (SA). The conventional way of sensing a PRE resistance is to convert the resistance value into a voltage by applying a current flowing through the PRE, then using a voltage amplifier to enlarge the voltage signal. This scheme depends on amplification of a MOS device that usually needs to be biased with substantial amount of current to have high gain.

FIG. 2 is a schematic diagram of a conventional sense amplifier 20. The SA 20 has a PMOS 21 with the gate coupled to the drain. The gate of PMOS 21 is also coupled to a gate of PMOS 22. The sources of PMOS 21 and 22 are coupled to a supply voltage VDD. The drains of PMOS 21 and 22 are coupled to drains of NMOS 23 and 24, respectively. The gates of NMOS 23 and 24 are coupled to a differential input signal, Vp and Vn, respectively. The sources of NMOS 23 and 24 are coupled to a drain of a NMOS 26, whose gate is coupled to an enable signal ϕ and whose source is coupled to ground. The input differential voltage between Vp and Vn can be amplified to the output Vout, at the drain of PMOS 22.

FIG. 3 is a schematic diagram of another conventional voltage sense amplifier 30. The scheme is to bias MOS devices in a latch into high gain region to amplify the differential signals and then latching the signals into two stable logic states. Biasing MOS in high gain region normally requires substantial amount of current. A PMOS 31 has a source coupled to a supply voltage VDD, a drain coupled to a drain of an NMOS 33, whose source is coupled to a drain of another NMOS 35. The gate of NMOS 33 is coupled to an input voltage V+. The gate of NMOS 35 is coupled to the gate of PMOS 31. There is also another similar branch that has a PMOS 32 having a source coupled to a supply voltage VDD, a drain coupled to a drain of a NMOS 34, whose source is coupled to a drain of another NMOS 36. The gate of NMOS 34 is coupled to another input voltage V−. The gate of NMOS 36 is coupled to the gate of PMOS 32. The sources of the NMOS 35 and 36 are coupled to a drain of an NMOS 39, whose gate is coupled to an enable signal ϕ and whose source is coupled to ground. The input differential signals of V+ and V− can be amplified to Vn and Vp, respectively, by turning on the enable signal ϕ. There are also another embodiments of voltage sensing by placing NMOS 33 and 34 between PMOS 31 and 32 and the supply voltage or placing them between NMOS 35 and 36 and the drain of the tailing NMOS 39.

The conventional approaches to voltage sensing in FIG. 2 or FIG. 3 depending on the supply voltage VDD and MOS threshold voltages Vtn and Vtp to bias the MOS devices in high gain region, which normally needs some amount of current. If the supply voltage is 0.8V and the Vtn and |Vtp| are about 0.3V, sensing the PRD with only 0.4V would be very difficult for MOS to be in high gain regions. Even if the voltage sense amplifier was able to operate, the MOS bias current in high gain region would be substantial for an sense amplifier (SA) to work. At least 100 uA would be needed to do so and achieving 1 uA of sensing current would be almost impossible. In IoT applications, there are some requests for sensing programmable resistive devices with only 0.4V voltage and 1 uA current, while the nominal supply voltage is 0.8V.

The conventional approaches to sensing a resistance by converting into voltage requires high supply voltage and high current. However, the industry trend in semiconductors is use of low supply voltage and low current consumption, especially in PC, tablet, smart phone, portable, and IoT applications. Thus, there is a need for improved approaches to sense resistance of programmable resistive memory cells under low voltage and low current conditions.

SUMMARY OF THE INVENTION

Embodiments of sensing programmable resistive device cells in low supply voltage with low current are disclosed. The methods and circuits of low voltage and low current sensing can be used in any kind of programmable resistive memories, such as OTP, MTP, PCRAM, RRAM, FeRAM, and MRAM, etc.

In one embodiment, a capacitor can be charged to near a supply voltage during a first period of time. Then, the capacitor can be discharged through a resistance in a second period of time. A voltage at the discharging capacitor can be compared with a reference voltage to change a memory read output. The time for an output logic device (e.g., comparison device) to change its output is determined by a product of the resistance and capacitance of the comparator. Since the capacitance is known, the time for the output logic device to change the output is related to the resistance value. Thus, the resistance can be determined by the time delay since start of the discharging. The longer the time delay, the larger the resistance. In this circuitry. In one implementation, MOS devices are only used as switches to turn on or off for charging or discharging. Therefore, the threshold voltages of the MOS devices are not crucial in this time-based sensing scheme.

The invention can be implemented in numerous ways, including as a method, system, device, or apparatus (including graphical user interface and computer readable medium). Several embodiments of the invention are discussed below.

As a programmable resistive memory, one embodiment can, for example, include at least a plurality of programmable resistive device (PRD) cells, and a time-based sensing circuit. The time-based sensing circuit can include at least: a capacitor selectably connected to a voltage source line; a selector controlled by a control signal, the selector having a first end and a second end, the second end being coupled to a first conductive line; a programmable resistive element (PRE) having a first end coupled to the capacitor and a second end coupled to the first end of the selector; and a comparator coupled to the first end of the PRE. The time-based sensing circuit can use different discharge times to determine resistance of the PRE.

As an electronic system, one embodiment can, for example, include at least a processor, and a programmable resistive memory operatively connected to the processor. The programmable resistive memory can include at least a plurality of programmable resistive device (PRD) cells for providing data storage, each of the PRD cells can include at least: a capacitor selectably connected to a voltage source line; a selector controlled by a control signal, the selector having a first end and a second end, the second end being coupled to a first conductive line; a programmable resistive element (PRE) having a first end coupled to the capacitor and a second end coupled to the first end of the selector; and a logic device coupled to the first end of the PRE.

As an electronic system, one embodiment can, for example, include at least a processor, and a programmable resistive memory operatively connected to the processor. The programmable resistive memory can include at least a plurality of programmable resistive device (PRD) cells for providing data storage. Each of the programmable resistive device cells can include at least a programmable resistive element (PRE) coupled to a first supply voltage line through a selector with an enable signal, and a time-base sensing circuit coupled to at least one PRD cell unit and a reference unit having the PRE and reference resistor, respectively; each unit has at least one capacitor that can be charged to a second supply voltage line and discharged through PRE and reference resistor, respectively, to the first supply voltage line; each unit has at least one comparator coupled to the capacitor to change output when the voltage discharged to a reference voltage. The PRE resistance can be converted into logic state by the time difference of the comparators changing outputs.

As a method for providing a programmable resistive memory including a plurality of programmable resistive device cells, at least one of the programmable resistive device cells including at least a programmable resistive element and a capacitor, one embodiment can, for example, include at least: charging the capacitor; ceasing the charging; subsequently coupling the programmable resistive element to the capacitor; monitoring a discharge rate of the capacitor while the programmable resistance element remains coupled to the capacitor; determining a resistance value of the programmable resistive element based on the monitoring of the discharge rate; and determining a logic state for the at least one of the programmable resistive device cells based in the determined resistance value of the programmable resistive element.

As a method for providing a programmable resistive memory, one embodiment can, for example, include at least providing a plurality of programmable resistive device cells, at least one of the programmable resistive device cells include at least (i) a programmable resistive element coupled to a first supply voltage line through a selector with an enable signal; and (ii) a time-base sensing circuit coupled to at least one PRD cell unit and a reference unit having PRE and a reference resistor, respectively; each unit has at least one capacitor that can be charged via a second supply voltage line and discharged through PRE and reference resistor, respectively, via the first supply voltage line; each unit has at least one comparator coupled to the respective capacitors to change output when the voltage discharged is compared to a reference voltage. The method can further include turning on the enable signal of the PRD unit and reference unit, after the capacitors are charged to the second supply voltage approximately, to discharge the capacitors through the PRE and reference element respectively; and converting the PRE resistance into logic states by the time difference of the comparator output changes.

BRIEF DESCRIPTION OF THE DRAWINGS

The present invention will be readily understood by the following detailed descriptions in conjunction with the accompanying drawings, wherein like reference numerals designate like structural elements, and in which:

FIG. 4(*b*) illustrates a timing waveform of a voltage being discharged according to one embodiment.

FIG. 5(*b*) illustrated a timing waveform of discharging capacitor voltages in a cell unit and a reference unit, according to one embodiment.

DETAILED DESCRIPTION OF THE INVENTION

Embodiments disclosed herein use capacitors discharging through programmable resistance element (PRE) to evaluate a programming state. By comparing a discharging time to reach a predetermined voltage, the PRE can be converted into a logic state. The discharging time can be compared with a discharge time provided by a separate unit that used a reference resistance. For example, comparison of discharging time to reach a predetermined voltage in two different units enables the resistance of the PRE to be evaluated and converted into a logic state.

In one embodiment, a programmable resistive memory has a plurality of programmable resistive devices (PRD) and at least one sensing circuit. The at least one of the programmable resistive device can include at least one programmable resistive element (PRE). The sensing circuit can include one PRD unit and a reference unit. Each unit has at least one capacitor to charge to a second supply voltage line and to discharge to the first supply voltage line through the PRE and the reference element, respectively. The capacitors are also coupled to comparators to monitor discharging voltages with respect to a reference voltage. By comparing the time difference when the comparators change their outputs, the magnitude of the PRE resistance with respect to the reference element resistance can be determined and converted into logic states.

The programmable resistive element and a sensing circuit can be included in a Programmable Resistive Device (PRD). Optionally, the programmable resistive element and a sensing circuit can be included within an electronic system.

The PRD can be a One-Time Programmable (OTP) device, such as electrical fuse (or anti-fuse). A current that flows through an OTP element (e.g., by turning on a selector) can program the OTP element or can burned the OTP element into a high or low resistance state (depending on either fuse or anti-fuse). The electrical fuse can be an interconnect or contact/via fuse. The interconnect fuse can be made of MOS gate, polysilicon, silicide, silicided polysilicon, metal, metal alloy, or thermally isolated active region. The contact or via fuse can be made of a single or a plurality of contact or via holes for programming. The anti-fuse can be made of breaking down a MOS oxide or a dielectric between conductors. The PRD can also be other kinds of memory devices, such as MTP, PCRAM, RRAM, Fe RAM, and MRAM that can be programmed more than once.

Any MOS devices in this sensing circuit are used as switches. Therefore, their threshold voltages related to the supply voltage are not crucial to the operation of the circuit. Thus, low voltage and low current sensing can be achieved in standard CMOS logic process without additional masks or process steps to save costs.

Figure 1:
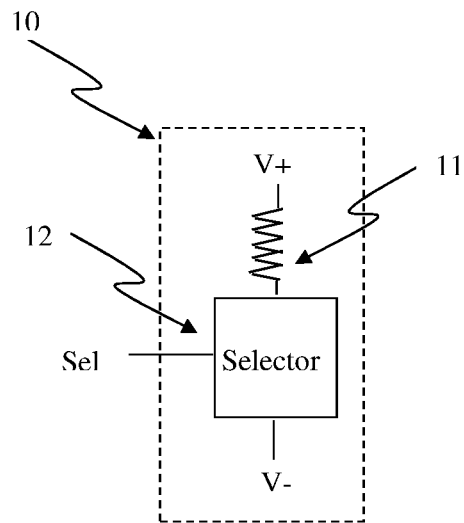
FIG. 1 shows a schematic diagram of a conventional programmable resistive memory device.
Figure 2:
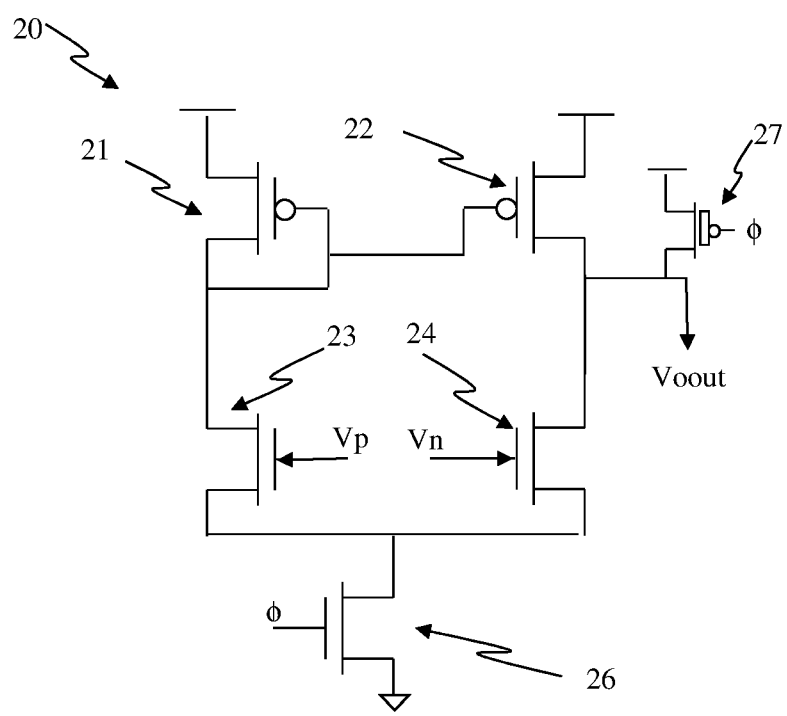
FIG. 2 shows a schematic diagram of a conventional voltage sense amplifier.
Figure 3:
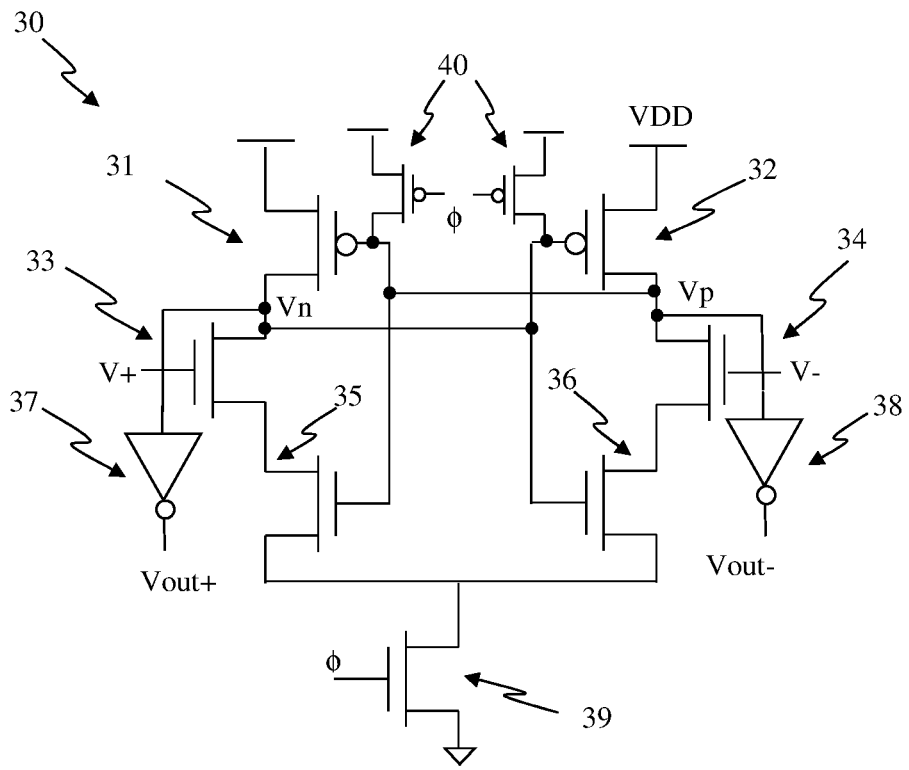
FIG. 3 shows a schematic diagram of a another conventional voltage sense amplifier.
Figure 4A:
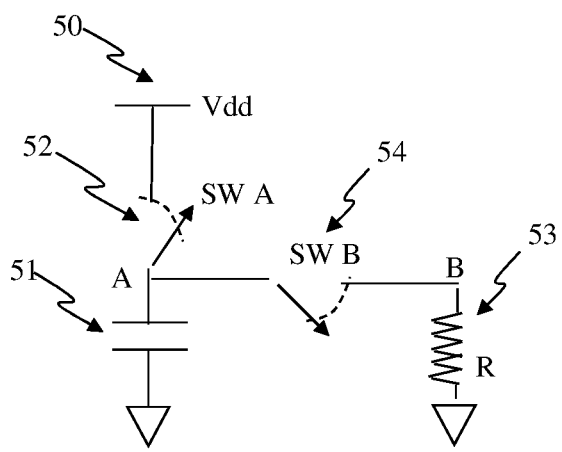
FIG. 4(*a*) illustrates a schematic diagram of a low power sensing circuit according to one embodiment.

FIG. 4(a) illustrates a schematic diagram of a low power sensing circuit 50 according to one embodiment. The sensing circuit 50 has a switch 52 coupled to a supply voltage VDD and to ground through a capacitor 51. The capacitor 51 is coupled to a switch 54 then to a resistive device 53 to ground. The capacitor 51 can be charged to VDD by turning on the switch 52 and turning off the switch 54. After the capacitor 51 is fully charged, the capacitor 51 can be discharged by turning on the switch 54 and turning off the switch 52. Thus, the voltage at node A at the capacitor 51 can be discharged according to a RC-time constant. The RC-time constant is dependent on the product of R and C. Since the capacitance (C) of the capacitor 51 can be fixed, the discharge rate will depend on resistance (R) of the resistive device 53.

Figure 4B:
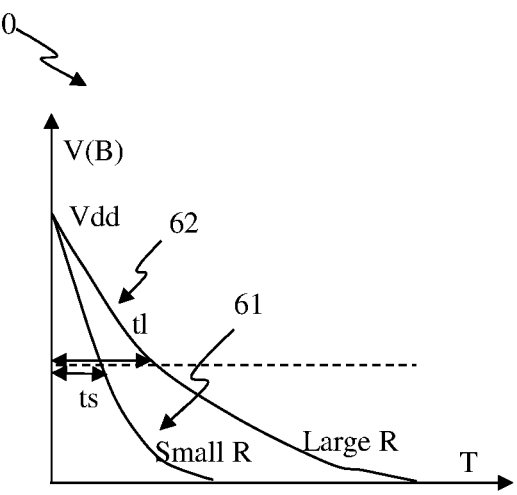

FIG. 4(b) illustrates a timing waveform of a voltage at node B being discharged according to one embodiment. If the resistance of the resistive device 53 has a larger resistance than a reference resistance, the discharge curve would look like 62. Conversely, if the resistance of the resistive device 53 has a smaller resistance than the reference resistance, the discharge curve would look like 61. If one-half VDD (Vdd/2) is the predetermined voltage, time delays is and t1 for curves 61 and 62, respectively, to reach the predetermined voltage are as shown in FIG. 4(b). The larger the resistance, the longer the time delay. In other words, the sensing circuit 50 converts resistance into time, as is depicted in FIG. 4(b) which relates voltage to time.

Figure 5A:
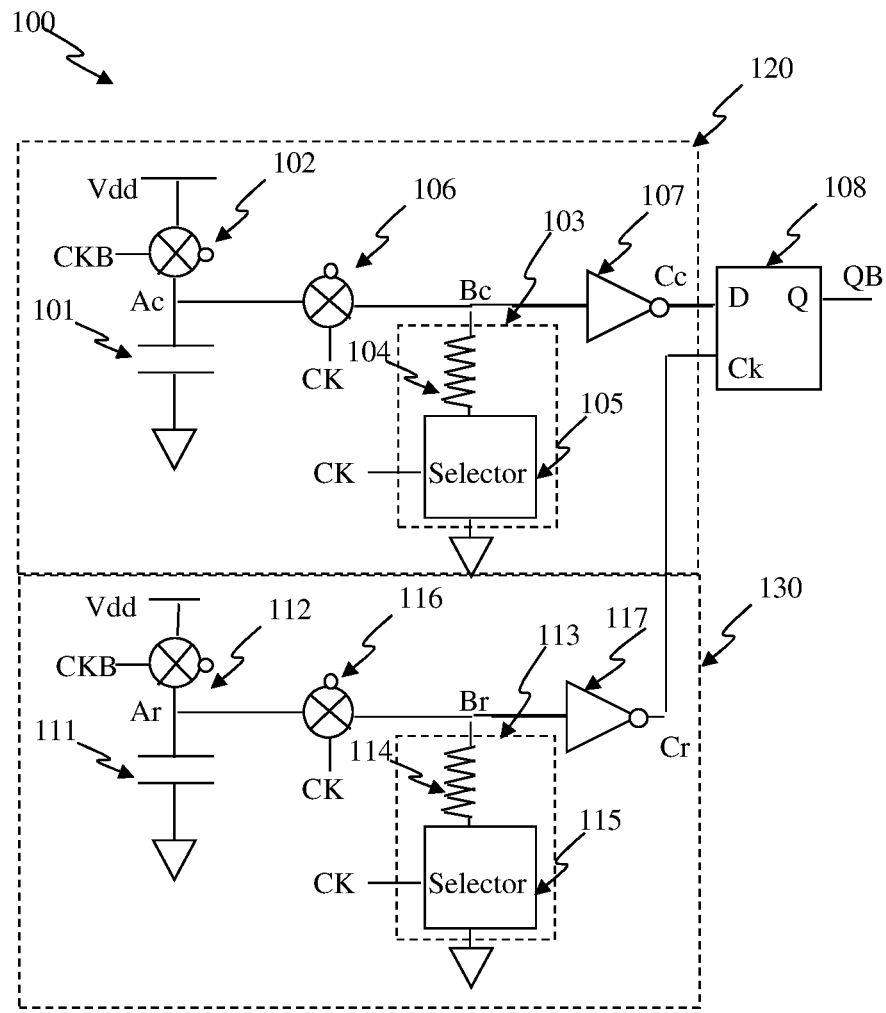
FIG. 5(*a*) illustrates a schematic diagram of time-based sensing circuit according to one embodiment.

FIG. 5(a) illustrates a schematic diagram of time-based sensing circuit 100, according to one embodiment. The time-based sensing circuit 100 has a cell unit 120 and a reference unit 130. The cell unit 120 has a capacitor 101 coupled to a supply voltage VDD through a charging pass gate 102 and coupled to a ground. The capacitor 101 is also coupled to a discharge pass gate 106. The discharge pass gate 106 couples to a programmable resistive device 103. The programmable resistive device 103 includes a programmable resistive element 104 coupled in series with a selector 105 that couples to ground. The discharge pass gate 106 is also coupled to an inverter 107, which can serve as a comparator or logic state converter.

The reference unit 130 has a capacitor 111 coupled to a supply voltage VDD through a charging pass gate 112 and coupled to a ground. The capacitor 111 is also coupled to a discharge pass gate 116. The discharge pass gate 106 couples to a reference device 113. The reference device 113 includes a reference element 114 coupled in series with a selector 115 that couples to ground. The discharge pass gate 116 is also coupled to an inverter 117, which can serve as a comparator or a logic state converter. The output of the inverters 107 and 117 can be coupled to an input and an enable a flip-flop 108, respectively. The output QB of the flip-flop 108 can represent a logic state of the PRE 104 with respect to the reference element 114.

The operation of time-based sensing circuit can be further elaborated as follows. The cell unit 120 includes the capacitor 101 and the reference unit 130 includes the capacitor 111. The capacitors 101 and 111 typically have the same capacitance C. The capacitors 101 and 111 can be charged to near VDD with assertion of CKB which turns on the charge pass gates 102 and 112, while the discharge pass gates 106 and 116 are turned off. When the capacitors 101 and 111 are nearly full charged, the charge pass gates 102 and 112 are turned off and the discharge pass gates 106 and 116 as well as the selectors 105 and 115 are turned on. The capacitors 101 and 111 will then be respectively discharged through the resistance of the PRE 104 and the reference element 114. The capacitors 101 and 111 are also coupled to inverters 107 and 117, respectively, that serve as logic comparators to generate logic states. Before discharge, the outputs of the inverters 107 and 117, as comparators, are all 0s. When the capacitor voltages have discharged below trip points of the inverters 107 and 117, the outputs of the inverters 107 and 117 will be independently changed to 1 s. If the output of the inverter 117 is changed to 1, the flip-flop 108 will be turned on to latch the output of the inverter 107. The output QB will be high if the resistance of the PRE 104 in the cell unit 120 has lower resistance than the resistance of reference element 114; otherwise, the flip-flop output QB will be low.

Figure 5B:
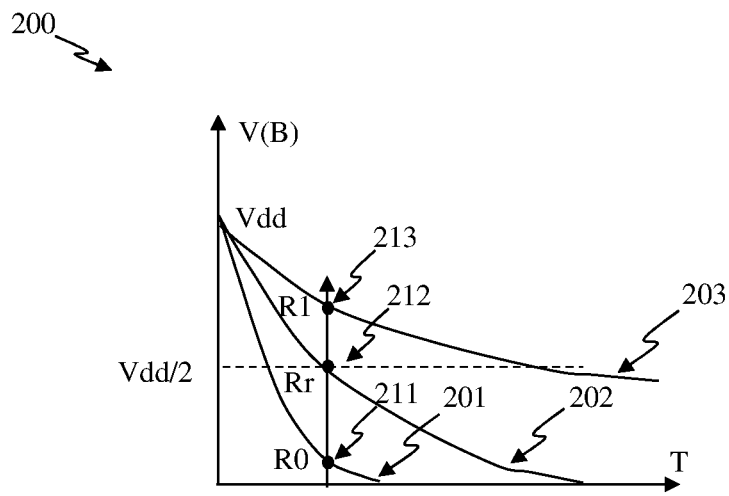

FIG. 5(b) illustrates a timing waveform 200 of the capacitor voltages at nodes Bc and Br in the cell unit 102 and the reference unit 130, respectively, according to one embodiment. A curve 202 shows discharging of the capacitor 111 in the reference unit 130. When the voltage at node Br reaches half VDD (Vdd/2), which is set as the trip point of the inverter 117, the output of the inverter 117 will become high. Then, the flip-flop will latch data 1 or 0 for curves 201 or 203, respectively, depending on whether the resistance of the PRE 104 in the cell unit 120 is lower or higher than the resistance of the reference element 114.

The time-based sensing circuit in FIG. 5(a) is merely an exemplary embodiment, many alterations or variations are possible. The pass gates can be embodied as NMOS, PMOS, or full CMOS pass gates. The capacitors can be made of MOS gate capacitor, Poly-Isolator-Poy (PIP), Metal-insulator-Metal (MIM) capacitor, or other type of capacitors. If MOS gate capacitor is used, thick oxide I/O devices are preferred over the core logic devices to reduce leakage current. The comparison devices (e.g., inverters or flip-flop) can be embodied as any kind of analog comparators or sense amplifiers, either static or dynamic comparators. The comparison devices can also be an arrangement of logic gates, such as inverters or Schmitt triggers to switch output when the input reaches certain voltage level. The reference voltage used for comparison can be any voltage between VDD and ground, though half VDD (Vdd/2) is a convenient voltage. The pass gates 106 and 116 can be omitted in some embodiments. The time to charge capacitors can be made longer than discharging time to reduce peak current in some embodiments, i.e. charging or discharging duty cycle need not be 50%. A transparent latch or flip-flop can be used to latch the output data in some embodiments. There can be many different varieties and yet equivalent embodiments and they all fall into the scope of this invention.

Figure 6:
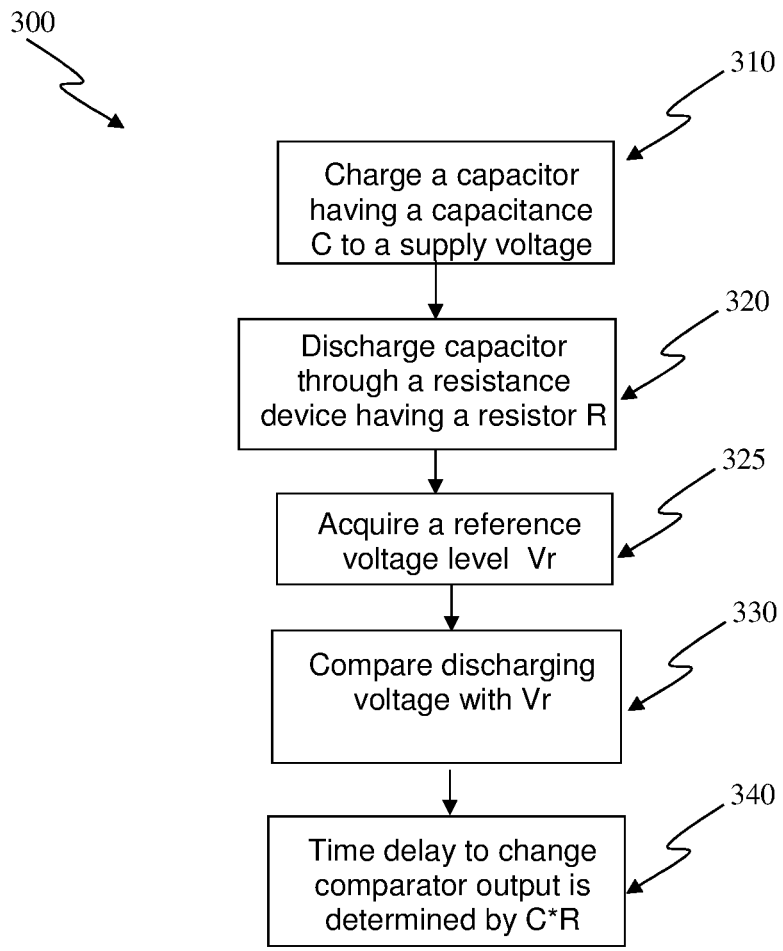
FIG. 6 is a flow diagram of a method of converting resistance into time according to one embodiment.

FIG. 6 is a flow diagram of a method 300 of converting resistance into time according to one embodiment. In the first step 310, a capacitor having a capacitance C is charged to near a supply voltage such as VDD. In the second step 320, the capacitor is discharged through a resistive device having a resistance R. In the third step 325, a fixed voltage is acquired as a reference voltage level. The fixed voltage can be previously determined or determined when needed. In the fourth step 330, compare the discharging voltage with the reference voltage level to determine if the discharging voltage has reached the reference voltage level. In the fifth step 340, the time from starting discharging the capacitance C of the capacitor until discharging voltage is determined to be at or less than the reference voltage level is determined by R*C. Since the capacitance C is fixed, the resistance R can be determined accordingly.

Figure 7:
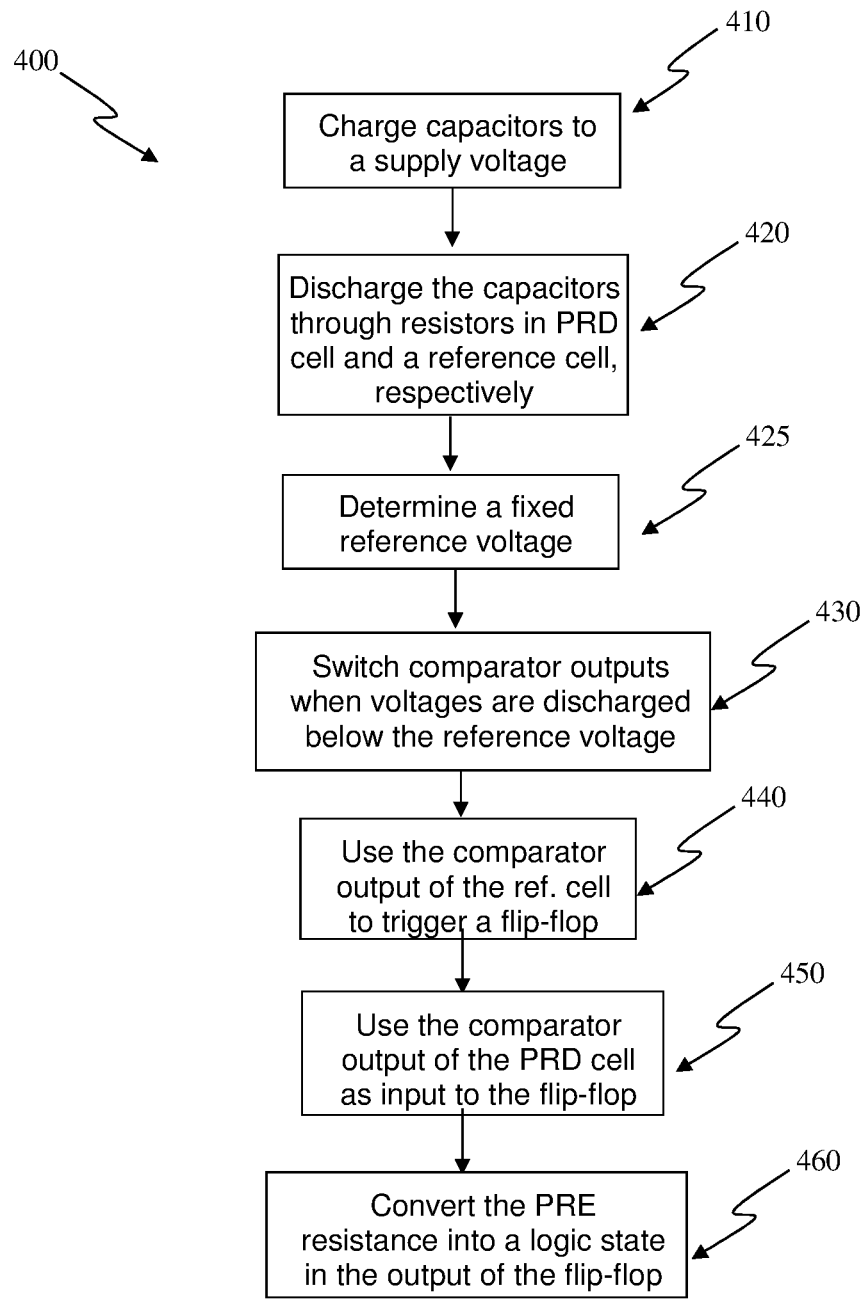
FIG. 7 is a flow diagram of a method of time-based resistance sensing according to one embodiment.

FIG. 7 is a flow diagram of a method 400 of time-based resistance sensing according to one embodiment. The method 400 can use a PRD cell and a reference unit. In the step 410, at least two capacitors are charged to near a supply voltage VDD. One capacitor is part of the PRD cell, and another capacitor is part of the reference unit. In the step 420, the two capacitors are discharged through a Programmable Resistive Element (PRE) and a reference element, respectively. The PRD cell includes the PRE, and the reference unit includes the reference element. In one implementation, the discharging can be initiated by turning on selectors. In the step 425, a fixed reference voltage to check voltage discharging can be determined. In the step 430, the fixed reference voltage can be compared with discharged voltages using comparators. The comparator outputs can independently change when the discharge voltages are discharged below the reference voltage level. In the step 440, the comparator output of the reference unit can be turned on to trigger a flip-flop when the discharge voltage level in the reference unit is discharged below the reference voltage level. In the step 450, the comparator output of the PRD cell is used as an input to the flip-flop. In the step 460, the output of the flip-flop is a logic state for the PRE resistance.

Figure 8:
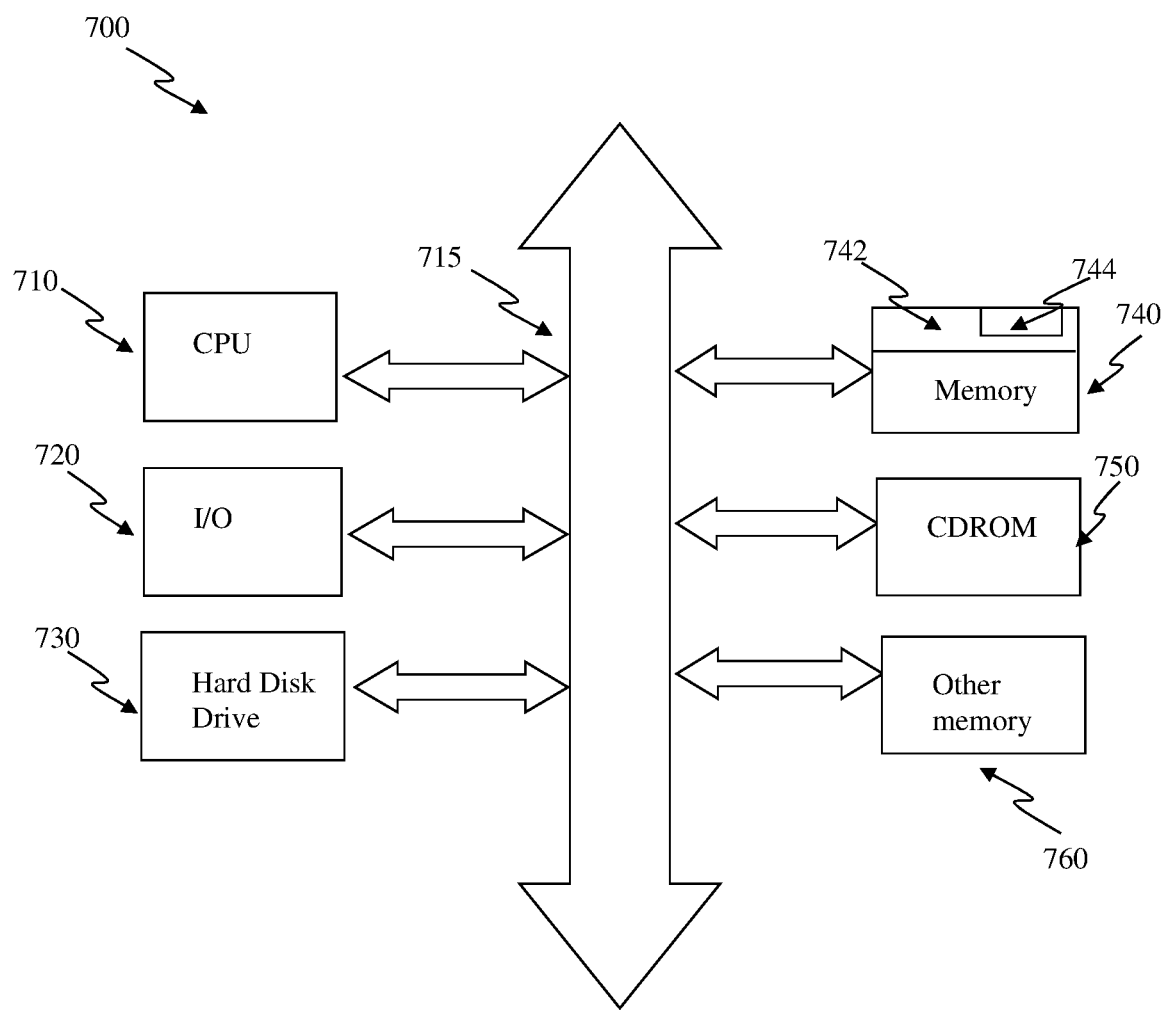
FIG. 8 shows a processor system with at least one programmable resistive memory using low voltage and low current sensing circuit, according to one embodiment.

FIG. 8 shows a processor system 700 according to one embodiment. The processor system 700 can include a programmable resistive device 744 and a time-base sensing circuit 742, in a programmable resistive memory 740, according to one embodiment. The processor system 700 can, for example, pertain to a computer system. The computer system can include a Central Process Unit (CPU) 710, which communicate through a common bus 715 to various memory and peripheral devices such as I/O 720, hard disk drive 730, CDROM 750, programmable resistive memory 740, and other memory 760. Other memory 760 is a conventional memory such as SRAM, DRAM, or flash, typically interfaces to CPU 710 through a memory controller. CPU 710 generally is a microprocessor, a digital signal processor, or other programmable digital logic devices. Programmable resistive memory 740 is preferably constructed as an integrated circuit, which includes a plurality of programmable resistive devices 744 in a memory array and at least one time-base sensing circuit 742. The programmable resistive memory 740 typically interfaces to CPU 710 with simple interface control or through a memory controller. If desired, the programmable resistive memory 740 may be combined with the processor, for example CPU 710, in a single integrated circuit.

The invention can be implemented in a part or all of an integrated circuit in a Printed Circuit Board (PCB), or in a system (electronic system, computing system, etc.). The programmable resistive memory can be fuse, anti-fuse, or emerging nonvolatile memory. The fuse can be silicided or non-silicided polysilicon fuse, metal fuse, thermally-isolated-active-area fuse, contact fuse, via fuse, or trench silicide in FinFET, or FinFET itself. The anti-fuse can be a gate-oxide breakdown anti-fuse, contact or via anti-fuse with dielectrics in-between. The emerging nonvolatile memory can be Magnetic RAM (MRAM), Phase Change Memory (PCM), Conductive Bridge RAM (CBRAM), Ferroelectric RAM (FeRAM) or Resistive RAM (RRAM). Though the program mechanisms are different, their logic states can be distinguished by different resistance values.

The above description and drawings are only to be considered illustrative of exemplary embodiments, which achieve the features and advantages of the present invention. Modifications and substitutions of specific process conditions and structures can be made without departing from the spirit and scope of the present invention.

The many features and advantages of the present invention are apparent from the written description and, thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A programmable resistive memory, comprises:
   a primary cell including at least:
      a selector controlled by a control signal, the selector having a first end and a second end, the second end being coupled to a first conductive line;
      a capacitor selectively coupled to a second conductive line; and
      a programmable resistive element (PRE) having a first end able to be coupled to the capacitor and a second end coupled to the first end of the selector; and
   a reference cell including at least:
      a reference selector controlled by the control signal, the reference selector having a first end and a second end, the second end being coupled to the first conductive line;

a reference capacitor selectively coupled to the second conductive line; and
a reference resistance element having a first end able to be coupled to the reference capacitor and a second end coupled to the first end of the reference selector, wherein a discharge time of the PRE relative to a discharge time of the reference resistance element is used to determine resistance of the PRE.

2. A programmable resistive memory as recited in claim 1, wherein the programmable resistive memory comprises:
a primary logic device able to be coupled to the first end of the PRE and operable to provide a primary logic state of the primary cell, and
a reference logic device able to be coupled to the first end of the reference resistance element and operable to provide a reference logic state of the reference cell.

3. A programmable resistive memory as recited in claim 2, wherein the programmable resistive memory includes at least one reference cell and a plurality of programmable resistive device (PRD) cells, each of the PRD cells including the primary cell, and
wherein the programmable resistive memory comprises:
an output logic device to output a logic state of the at least one of the PRD cells, the output logic device being coupled to the primary logic device and the reference logic device.

4. A programmable resistive memory as recited in claim 1, wherein the programmable resistive element comprises one-time programmable (OTP) element in OTP memory, magnetic tunnel junction (MTJ) in an MRAM or RRAM element in an RRAM.

5. A programmable resistive memory, comprises:
a plurality of programmable resistive device (PRD) cells; and
a time-based sensing circuit including at least:
a selector controlled by a control signal, the selector having a first end and a second end, the second end being coupled to a first conductive line;
a capacitor selectively coupled to a second conductive line;
a programmable resistive element (PRE) having a first end coupled to the capacitor and a second end coupled to the first end of the selector; and
a comparator coupled to the first end of the PRE,
wherein the time-based sensing circuit using different discharge time to determine resistance of the PRE,
wherein the programmable resistive element is an one-time programmable (OTP) element that comprises at least one of an anti-fuse, fuse or floating-gate device.

6. A programmable resistive memory, comprises:
a plurality of programmable resistive device (PRD) cells; and
a time-based sensing circuit including at least:
a selector controlled by a control signal, the selector having a first end and a second end, the second end being coupled to a first conductive line;
a capacitor selectively coupled to a second conductive line;
a programmable resistive element (PRE) having a first end coupled to the capacitor and a second end coupled to the first end of the selector; and
a comparator coupled to the first end of the PRE,
wherein the time-based sensing circuit using different discharge times to determine resistance of the PRE,
wherein the programmable resistive element comprises at least one of RRAM or MRAM device.

7. A programmable resistive memory as recited in claim 1, wherein the programmable resistive memory comprises:
a primary switch coupled to the first end of the PRE, and
a reference switch coupled to the first end of the reference resistance element.

8. An electronic system, comprises:
a processor; and
a programmable resistive memory operatively connected to the processor, the programmable resistive memory includes at least a plurality of programmable resistive device (PRD) cells for providing data storage, each of the programmable resistive device cells comprising:
a programmable resistive element (PRE) coupled to a first supply voltage line through a selector with an enable signal; and
a time-base sensing circuit coupled to at least one PRD cell unit and a reference unit having a PRE and a reference resistor, respectively; each of the PRD cell unit and the reference unit are coupled to capacitors that can be charged to a second supply voltage line and discharged through the PRE and the reference resistor, respectively, to the first supply voltage line; the PRD cell unit and the reference unit are coupled to at least one comparator to change output logic state when the voltages are discharged to a reference voltage,
wherein the capacitors in both units are charged to the second supply voltage approximately and discharged to the first supply voltage line by turning on the enable signal at the same time, and
wherein the PRE resistance can be converted into logic state based on different discharge rates by the PRD cell unit and the reference unit.

9. An electronic system as recited in claim 8, wherein the comparator outputs of the cell and reference units are coupled to latches or flip-flops, respectively, and an output of the latch or flip-flop depends on whether the PRE resistance is larger or smaller than the reference resistance.

10. An electronic system as recited in claim 8, wherein the reference voltage for the comparator is approximately half way between the first and the second supply voltages.

11. An electronic system as recited in claim 8, wherein the programmable resistive element comprises at least one of floating-gate device, electrical-fuse, phase-change film in PCRAM, resistive film in RRAM, ferroelectric film in FeRAM, or magnetic tunnel junction in MRAM.

12. An electronic system as recited in claim 8, wherein the programmable resistive element comprises at least one of polysilicon, silicided polysilicon, silicide, metal, metal alloy, thermal isolated active region, trench silicide in FinFET, FinFET itself, or MOS gate.

13. An electronic system as recited in claim 8, wherein the programmable resistive element is an anti-fuse fabricated by a single or plural of contacts or vias with dielectrics in between, or an anti-fuse comprising of a CMOS gate and a CMOS body with gate oxide in between.

14. An electronic system as recited in claim 8, wherein the comparator is an inverter.

15. A method for providing a programmable resistive memory, comprising:
providing a plurality of programmable resistive device cells, at least one of the programmable resistive device cells include at least (i) a programmable resistive element coupled to a first supply voltage line through a selector with an enable signal; and (ii) a time-base sensing circuit coupled to at least one PRD cell unit and a reference unit having a PRE and a reference resistor, respectively; the PRD cell unit and the reference unit are coupled to at least one capacitor that can be charged to a second supply voltage line and discharged through the PRE and the reference resistor, respectively, to the first supply voltage line; the PRD cell and the reference unit are coupled to at least one comparator, and wherein the comparator changes output logic states based on a comparison of the voltage discharged to a reference voltage;

turning on the enable signal of the PRD unit and reference unit, after the capacitors are charged to the second supply voltage approximately, to discharge the capacitors through the PRE and reference element respectively; and converting the PRE resistance into logic states by the time difference of the comparator output changes.

16. A method as recited in claim 15, wherein the programmable resistive device cells are one-time programmable memory cells.

17. A method as recited in claim 16, wherein a discharge rate is dependent on capacitance of the capacitor and the resistance value.

18. A method as recited in claim 17, wherein the programmable resistive element comprises at least one MRAM device.

19. A method as recited in claim 17, wherein the programmable resistive element comprises at least one RRAM.

* * * * *